(12) United States Patent
  Seol et al.

(10) Patent No.: US 12,684,823 B2
(45) Date of Patent: Jul. 14, 2026

(54) LAYER STRUCTURES INCLUDING CONFIGURATION INCREASING OPERATION CHARACTERISTICS, METHODS OF MANUFACTURING THE SAME, ELECTRONIC DEVICES INCLUDING LAYER STRUCTURES, AND ELECTRONIC APPARATUSES INCLUDING ELECTRONIC DEVICES

(71) Applicant: Samsung Electronics Co., Ltd., Suwon-si (KR)

(72) Inventors: Minsu Seol, Seoul (KR); Junyoung Kwon, Seoul (KR); Minseok Yoo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 510 days.

(21) Appl. No.: 17/831,950

(22) Filed: Jun. 3, 2022

(65) Prior Publication Data

US 2023/0036321 A1     Feb. 2, 2023

(30) Foreign Application Priority Data

Jul. 29, 2021     (KR) ........................ 10-2021-0100140

(51) Int. Cl.
  *H10D 30/69*      (2025.01)
  *H10D 30/01*      (2025.01)
  *H10D 30/67*      (2025.01)
  *H10D 62/10*      (2025.01)
  *H10D 62/80*      (2025.01)
  *H10D 84/01*      (2025.01)
  *H10D 84/03*      (2025.01)

(52) U.S. Cl.
  CPC ......... *H10D 30/791* (2025.01); *H10D 30/031* (2025.01); *H10D 30/6735* (2025.01);
  (Continued)

(58) Field of Classification Search
  CPC ............. H01L 29/0673; H01L 29/1054; H01L 29/1606; H01L 29/42392; H01L 29/778;
  (Continued)

(56) References Cited

U.S. PATENT DOCUMENTS 10,388,732 B1    8/2019   Frougier et al.
10,741,646 B2    8/2020   Yeh et al.
  (Continued)

FOREIGN PATENT DOCUMENTS

CN        112289856 A      1/2021
JP      2011/029303 A      2/2011
  (Continued)

OTHER PUBLICATIONS

Jaikissoon, M. et al., CMOS-compatible strain engineering for monolayer semiconductor transistors. Nat Electron 7, 885-891 (2024). https://doi.org/10.1038/s41928-024-01244-7.
  (Continued)

*Primary Examiner* — Zandra V Smith
*Assistant Examiner* — Molly K Reida
(74) *Attorney, Agent, or Firm* — HARNESS, DICKEY & PIERCE, P.L.C.

(57) ABSTRACT

Provided are a layer structure including a configuration capable of increasing the operation characteristics of a device including the layer structure, a method of manufacturing the layer structure, an electronic device including the layer structure, and an electronic apparatus including the electronic device. The layer structure includes a first layer and a second layer on one surface of the first layer and facing the first layer. The first layer and the second layer overlap each other. One layer of the first layer and the second layer has a trace of applied strain, and an other layer of the first layer and the second layer is a strain-inducing layer that applies a strain to the one layer.

7 Claims, 17 Drawing Sheets

(52) U.S. Cl.
CPC ..... *H10D 30/6739* (2025.01); *H10D 30/6757* (2025.01); *H10D 30/751* (2025.01); *H10D 30/792* (2025.01); *H10D 30/794* (2025.01); *H10D 62/121* (2025.01); *H10D 62/881* (2025.01); *H10D 62/882* (2025.01); *H10D 62/883* (2025.01); *H10D 84/0167* (2025.01); *H10D 84/038* (2025.01)

(58) Field of Classification Search
CPC ............. H01L 29/7843; H01L 29/7845; H01L 29/7849; H10D 62/881; H10D 62/882; H10D 62/883; H10D 62/80; H10D 62/83; H10D 62/8503; H10D 62/8303; H10D 62/871; H10D 62/874; H10D 62/791–798
See application file for complete search history.

(56) References Cited

U.S. PATENT DOCUMENTS

| | | | | |
|---|---|---|---|---|
| 2010/0252800 | A1* | 10/2010 | Chidambarrao | ..... H10D 86/215 |
| | | | | 977/762 |
| 2015/0122315 | A1 | 5/2015 | Shin et al. | |

| | | | | |
|---|---|---|---|---|
| 2015/0200202 | A1 | 7/2015 | Karda et al. | |
| 2016/0284671 | A1 | 9/2016 | Stuber et al. | |
| 2018/0012962 | A1* | 1/2018 | Yeh | ................... H01L 29/66795 |
| 2018/0151751 | A1* | 5/2018 | Yeh | ......................... H10D 99/00 |
| 2020/0184315 | A1 | 6/2020 | Kim et al. | |
| 2022/0077321 | A1* | 3/2022 | Seol | ...................... H01L 29/778 |
| 2022/0109051 | A1 | 4/2022 | Lee et al. | |
| 2022/0376113 | A1 | 11/2022 | Yamazaki et al. | |
| 2023/0103876 | A1 | 4/2023 | Yoo et al. | |

FOREIGN PATENT DOCUMENTS

| | | | |
|---|---|---|---|
| KR | 2017/0058439 | A | 5/2017 |
| KR | 101777912 | B1 | 9/2017 |
| KR | 2019/0137721 | A | 12/2019 |
| KR | 2019/0137731 | A | 12/2019 |
| WO | 2021/090106 | A1 | 5/2021 |

OTHER PUBLICATIONS

Korean Office Action dated Dec. 16, 2025 for corresponding Korean Patent Application No. 10-2021-0100140 and its English-language translation.

* cited by examiner

1700

LAYER STRUCTURES INCLUDING CONFIGURATION INCREASING OPERATION CHARACTERISTICS, METHODS OF MANUFACTURING THE SAME, ELECTRONIC DEVICES INCLUDING LAYER STRUCTURES, AND ELECTRONIC APPARATUSES INCLUDING ELECTRONIC DEVICES

CROSS-REFERENCE TO RELATED APPLICATION

This application is based on and claims priority under 35 U.S.C. § 119 to Korean Patent Application No. 10-2021-0100140, filed on Jul. 29, 2021, in the Korean Intellectual Property Office, the disclosure of which is incorporated by reference herein in its entirety.

BACKGROUND

1. Field

The present disclosure relates to electronic apparatuses, and more particularly, to layer structures including a configuration for increasing operation characteristics, methods of manufacturing the same, electronic devices including the layer structures, and/or electronic apparatuses including the electronic devices.

2. Description of the Related Art

When a two-dimensional material is used as a channel, a short channel effect may be reduced, and thus, channel scaling may be advantageous. Also, when a two-dimensional material, such as $MoS_2$ or $WS_2$ is used as a channel, there may be an advantage in that power may be reduced according to a low off-current and a high on-off ratio due to a greater band gap compared to silicon (Si).

As the mobility of a channel increases, an on-current may increase. Therefore, a device having a relatively large channel mobility may be classified as a high-performance device. However, the mobility may vary with the material used as a channel, and there also may be limitations. Accordingly, various methods for further increasing channel mobility have been studied.

SUMMARY

Provided are layer structures capable of increasing carrier mobility of a material layer through which carriers are moved.

Provided are methods of manufacturing the layer structures.

Provided are electronic devices including the layer structures.

Provided are electronic apparatuses including the electronic devices.

Additional aspects will be set forth in part in the description which follows and, in part, will be apparent from the description, or may be learned by practice of the presented embodiments of the disclosure.

According to an embodiment, a layer structure may include a first layer and a second layer on one surface of the first layer and facing the first layer. The first layer and the second layer overlap each other. One layer of the first layer and the second layer may have a trace of applied strain. An other layer of the first layer and the second layer may be a strain-inducing layer that applies strain to the one layer.

In some embodiments, the layer structure may further include a buffer layer between the first layer and the second layer.

In some embodiments, the strain-inducing layer may include a conductive layer.

In some embodiments, the buffer layer may directly contact the first layer, and the first layer may be the one layer having the trace of applied strain.

In some embodiments, the buffer layer may directly contact the second layer, and the first layer may be the one layer having the trace of applied strain.

In some embodiments, a thickness of the strain-inducing layer may be greater than a thickness of the one layer having the trace of applied strain.

In some embodiments, a coefficient of thermal expansion of the first layer may be different than a coefficient of thermal expansion of the second layer.

In some embodiments, the trace of applied strain may include a trace caused by a tensile strain or a compressive strain.

In some embodiments, the one layer having the trace of applied strain may have a band gap greater than a reference band gap or less than a reference band gap, and the reference band gap may be a band gap of the one layer when the one layer is unstrained.

In some embodiments, the trace may include a spectroscopic trace caused by a band gap difference.

In some embodiments, the one layer having the trace may include a P-type material layer or a N-type material layer.

In some embodiments, the first layer and the second layer may be sequentially stacked in a vertical direction.

In some embodiments, the one layer having the trace may include a two-dimensional material layer.

In some embodiments, the strain-inducing layer may include an insulating layer.

In some embodiments, the first layer may directly contact the second layer.

In some embodiments, a width of the first layer may be different than a width of the second layer.

In some embodiments, an electronic device may include an electrode contacting the layer structure.

In some embodiments, the strain-inducing layer may include an insulating layer or a conductive layer.

According to an embodiment, an electronic device may include: the layer structure according to the embodiment; a substrate, a first electrode on the substrate, a second electrode on the substrate and separated from the first electrode; a gate electrode on the substrate and separated from the first electrode and the second electrode; a channel layer connected to the first electrode and the second electrode, the channel layer separated from the gate electrode; and a stressor layer facing the channel layer. The channel layer may include the one layer of the layer structure and the stressor layer may include the other layer of the layer structure.

In some embodiments, the electronic device may include a buffer layer between the channel layer and the stressor layer.

In some embodiments, the gate electrode may be above the channel layer or below the channel layer.

In some embodiments, the gate electrode may be under the stressor layer and may have an aspect ratio greater than or equal to 1.

In some embodiments, the stressor layer may be under the gate electrode and may have an aspect ratio greater than or equal to 1.

In some embodiments, the channel layer may include a plurality of channels, and the plurality of channels may be vertically stacked and may have a hollow closed-type cross-sectional structure.

In some embodiments, the channel layer may include a plurality of horizontal parts and a plurality of vertical parts. The plurality of horizontal parts may be sequentially stacked on the substrate, and the plurality of vertical parts may contact the first electrode and the second electrode.

According to an embodiment, an electronic device may include the layer structure according to the embodiment; a substrate; a first electrode on the substrate; a second electrode on the substrate and separated from the first electrode; a gate electrode separated from the first electrode and the second electrode; and a channel layer connected to the first electrode and the second electrode. The channel layer may be separated from the gate electrode. The channel layer may include the one layer of the layer structure and the gate electrode may include the other layer of the layer structure.

In some embodiments, the gate electrode may be above the channel layer or below the channel layer.

In some embodiments, the gate electrode may have an aspect ratio greater than or equal to 1.

In some embodiments, the channel layer may include a plurality of channels, and the plurality of channels may be vertically stacked and may have a hollow closed-type cross-sectional structure.

In some embodiments, the channel layer may include a plurality of horizontal parts and a plurality of vertical parts. The plurality of horizontal parts may be sequentially stacked on the substrate, and the plurality of vertical parts may contact the first electrode and the second electrode.

In some embodiments, an electronic apparatus may be configured to control a flow of an electrical signal. The electronic device may include the electronic device according to the embodiment.

According to an embodiment, a method of manufacturing a layer structure may include: forming a first layer at a first temperature, the first temperature being greater than a room temperature; forming a second layer on the first layer at a second temperature, the second temperature being greater than a room temperature; and performing a cooling operation that includes cooling the first layer and the second layer to the room temperature. One layer, among the first layer and the second layer, may include a strain-inducing layer configured to intentionally induce a strain in an other layer in the cooling operation. The other layer may be among the first layer and the second layer.

In some embodiments, a thickness of the one layer may be greater than a thickness of the other layer.

In some embodiments, the other layer may include a two-dimensional layer.

In some embodiments, the one layer may include an insulating layer, and a difference between a coefficient of thermal expansion of the one layer and a coefficient of thermal expansion of the other layer may be in a range of about $1\times10^{-6}/^\circ$ C. to about $50\times10^{-6}/^\circ$ C.

In some embodiments, the one layer may include a conductive layer, and a difference between a coefficient of thermal expansion of the one layer and a coefficient of thermal expansion of the other layer may be in a range of about $1\times10^{-6}/^\circ$ C. to about $50\times10^{-6}/^\circ$ C.

4

In some embodiments, the method may include forming a member between the forming the first layer and the forming the second layer.

In some embodiments, the member may include a buffer layer between the first layer and the second layer, and the member may be in contact with the first layer and the second layer.

In some embodiments, the member may include an electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
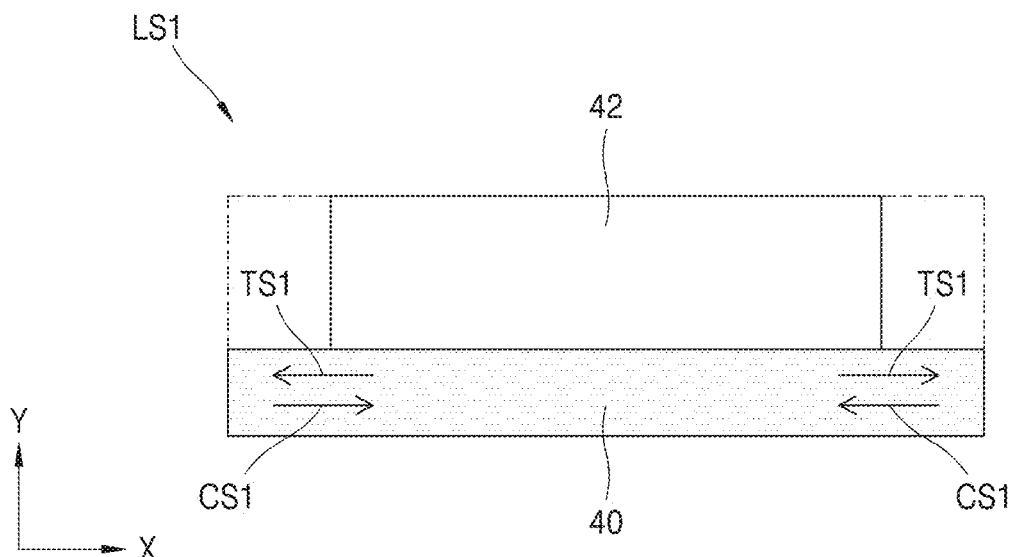
FIGS. 1 to 4 are cross-sectional views illustrating layer structures including a configuration for increasing operation characteristics according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a layer structure including a configuration for increasing operation characteristics according to an embodiment, a method of manufacturing the layer structure, an electronic device including the layer structure, and an electronic apparatus including the electronic device are described in detail with reference to the accompanying drawings. The method of manufacturing the layer structure will be described together in a process of explaining the layer structure. In the following description, thickness of layers or regions in the drawings may be exaggerated for clarity of the specification. The embodiments of the inventive concept are capable of various modifications and may be embodied in many different forms. Also, when an element or layer is referred to as being "on" or "above" another element or layer, the element or layer may be directly on another element or layer or intervening elements or layers. In the following descriptions, like reference numerals refer to like elements throughout.

FIG. 1 shows a first layer structure LS1 including a configuration for increasing operation characteristics according to an embodiment.

Referring to FIG. 1, the first layer structure LS1 may include a first layer 40 and a second layer 42 sequentially stacked. The first layer 40 may be expressed as a first material layer, and the second layer 42 may be expressed as a second material layer. The first layer 40 and the second layer 42 may be formed parallel to each other in a first direction (e.g., an X-axis direction). The second layer 42 may be provided on a region of one surface of the first layer 40, but may be formed on an entire region of the one surface of the first layer 40 as indicated by a dashed line. The second layer 42 may directly contact the first layer 40. The one surface of the first layer 40 may be a surface parallel to the first direction, and in one example, the one surface may be an upper surface of the first layer 40. 'Upper surface' or 'lower surface' is a relative expression, and depending on a viewpoint from which the first layer structure LS1 is viewed, an upper surface (or a lower surface) may be a lower surface (or an upper surface) or a side surface.

The first layer 40 and the second layer 42 may be material layers having different coefficients of thermal expansion or may include such material layers. The coefficient of thermal expansion of the second layer 42 may be greater than or less than the coefficient of thermal expansion of the first layer 40. In one example, the difference between the coefficients of thermal expansion of the first layer 40 and the second layer 42 may be in a range of about $1 \times 10^{-6}/°$ C. to about $50 \times 10^{-6}/°$ C., and in one example, may be in a range of about 1 ppm/° C. to about 20 ppm/° C.

The first layer structure LS1 may be formed by a process including a first operation of forming the second layer 42 on the first layer 40 in a first temperature range greater than room temperature and a second operation of cooling the resultant product formed in the first operation to a second temperature less than the first temperature range. The first layer 40 and the second layer 42 may be formed at the same temperature or different temperatures in the first temperature range. The second operation may be performed immediately after the first operation, or another operation may further be performed between the first and second operations. In one example, the second layer 42 may be a layer provided to intentionally induce strain in the first layer 40 in the cooling operation. In one example, the first temperature may be in a range of about 100° C. to about 1000° C. In one example, the second temperature may be room temperature. In an example, the operation of forming another member may be performed between the first operation and the second operation. In one example, the other member may include an electrode.

When the coefficient of thermal expansion of the second layer 42 is greater than that of the first layer 40, in the cooling process (second operation), the first layer 40 having a relatively less coefficient of thermal expansion than that of the second layer 42 receives a compressive strain CS1 by the second layer 42.

Conversely, when the coefficient of thermal expansion of the second layer 42 is less than that of the first layer 40, in the cooling operation, the first layer 40 having a relatively greater coefficient of thermal expansion than the second layer 42 receives a tensile strain TS1 by the second layer 42.

Accordingly, when the first layer 40 is a moving path of a carrier, for example, when the first layer 40 is used as a channel of the carrier, the mobility of the carrier flowing through the first layer 40 may be increased by controlling the strain applied to the first layer 40. In other words, by controlling the strain applied to the first layer 40 to a specific strain during the manufacturing process, the mobility of a specific carrier flowing through the first layer 40 may be increased.

In one example, the carrier may be electrons or holes. In one example, when the first and second layers 40 and 42 are formed to apply a tensile strain TS1 to the first layer 40, and when the first layer 40 is a channel through which electrons move as primary carriers, the electron mobility of the first layer 40 may be increased compared to when the tensile strain TS1 is not applied.

In one example, when the first and second layers 40 and 42 are formed to apply a compressive strain CS1 to the first layer 40, and when the first layer 40 is a channel through which holes move as primary carriers, the hole mobility of the first layer 40 may be increased compared to when the compressive strain CS1 is not applied.

A band gap of the first layer 40 may vary according to the type of strain applied to the first layer 40. For example, when the first layer 40 does not receive strain, that is, when the first layer 40 is strain-free, the band gap of the first layer 40 is referred to as a reference band gap, and when the first layer 40 receives tensile strain, the band gap of the first layer 40 is less than the reference band gap. On the other hand, when the first layer 40 receives compressive strain, the band gap of the first layer 40 is greater than the reference band gap. This characteristic may be a trace that the first layer 40 has been strained or that the first layer 40 is in a strained state. Based on these characteristics, whether the first layer 40 receives strain or not, the type of strain, and the degree of the strain received by the first layer 40 may be checked. Such confirmation may be performed through a Raman spectroscopy or photoluminescence (PL) analysis. For example, the position of a Raman peak may be reversed depending on the type of strain or the direction of the strain applied to the first layer 40. Also, as the magnitude of the strain increases, the degree of the peak shift increases and a full width at half maximum (FWAM) also increases.

In this way, because the trace may be identified through a spectroscopic analysis, the trace may be referred to as a spectroscopic trace.

Next, the first layer 40 may be a two-dimensional material layer or may include a two-dimensional material, but is not limited thereto. In one example, the two-dimensional material may include transition metal dichalcogenide (TMD), black phosphorus (BP), or a material including carbon (C). The TMD may include one of transition metals, such as Mo, W, Nb, V, Ta, Ti, Zr, Hf, Tc, Re, Cu, Ga, In, Sn, Ge and Pb and one of S, Se and Te. In one example, the TMD may include $MoS_2$, $WS_2$, $MoSe_2$, or $WSe_2$. In one example, the material including carbon may include graphene.

As described above, the second layer 42 is a stressor layer that induces a strain CS1 or TS1 in the first layer 40 during a manufacturing process. That is, a strain is applied to the first layer 40 by the second layer 42. In one example, the second layer 42 may be an insulating layer or a conductive layer. In the first layer structure ST1, the second layer 42 may be an insulating layer or may include an insulating layer. In one example, the insulating layer may be a nitride or an oxide, or may include a nitride or an oxide. In one example, the nitride may be silicon nitride (e.g., $Si_3N_4$) or may include silicon nitride. In one example, the oxide may be silicon oxide or may include silicon oxide.

Figure 2:
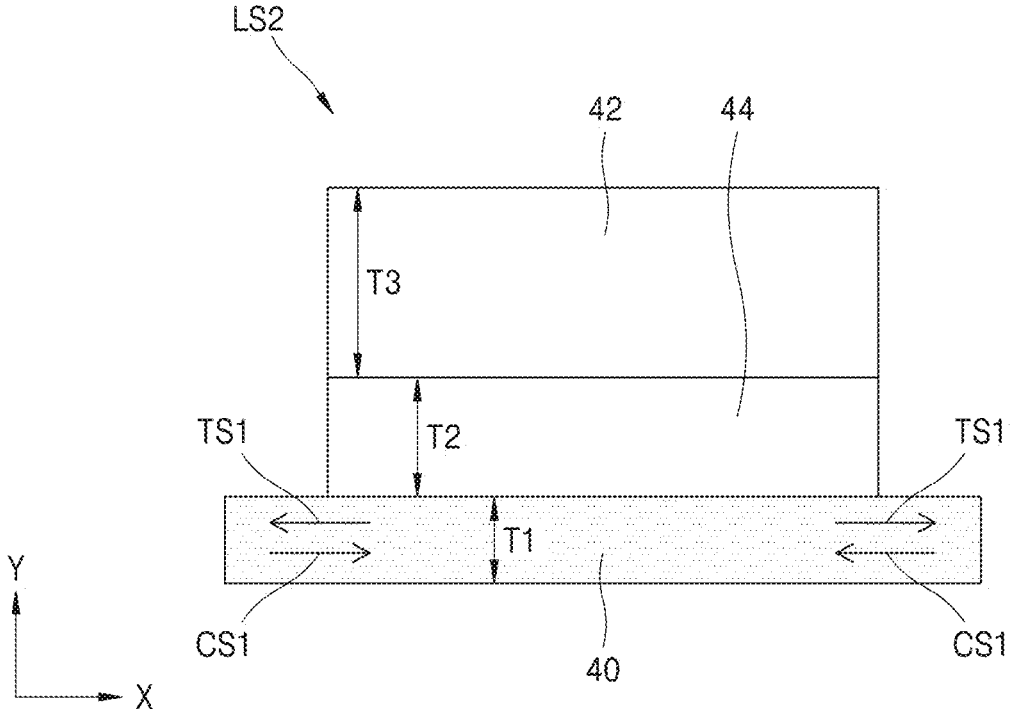

FIG. 2 shows a second layer structure LS2 that increases operation characteristics according to an embodiment. Only parts different from the first layer structure LS1 will be described.

Referring to FIG. 2, the second layer structure LS2 further includes a buffer layer 44 between the first layer 40 and the second layer 42. The second layer structure LS2 may be formed by sequentially stacking the buffer layer 44 and the second layer 42 on the first layer 40. In one example, at least one of the first layer 40, the buffer layer 44, and the second layer 42 may be formed by using an atomic layer deposition (ALD) method. The first layer 40 may be formed to a first thickness T1, the buffer layer 44 may be formed to a second thickness T2, and the second layer 42 may be formed to a third thickness T3. In one example, it may be T3>T2>T1. In one example, the first thickness T1 may be in a range of about 0.3 nm to about 5.0 nm, the second thickness T2 may be in a range of about 1 nm to about 20 nm, and the third thickness T3 may be in a range of about 1 nm to about 200 nm. Due to the thickness difference, even when the buffer layer 44 is arranged between the first layer 40 and the second layer 42, the same strain as in the first layer structure LS1 may be induced in the first layer 40 by the second layer 42. Because the buffer layer 44 is provided, damage to the first layer 40 may be limited and/or prevented even when a large strain is applied to the first layer 40. In one example, the buffer layer 44 may be or include an insulating layer. In one example, the buffer layer 44 may be or include an $Al_2O_3$ layer or an $HfO_2$ layer. In the second layer structure LS2, the second layer 42 may be an insulating layer or a conductive layer.

Figure 3:
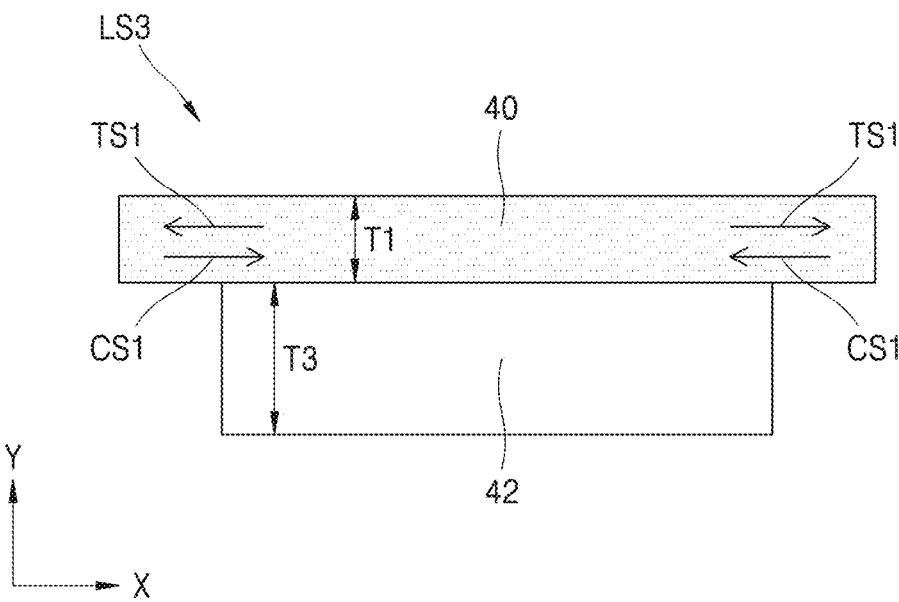

FIG. 3 shows a third layer structure LS3 including a configuration for increasing operation characteristics according to an embodiment.

Only parts different from the first layer structure LS1 will be described.

Referring to FIG. 3, the third layer structure LS3 is a structure in which the second layer 42 is arranged under the first layer 40. That is, the third layer structure LS3 is a structure formed by sequentially stacking the second layer 42 and the first layer 40. The third layer structure LS3 may also be formed in the first temperature range described in the method of forming the first layer structure LS1 and then cooled to the second temperature, and in this process, a strain due to a difference in coefficients of thermal expansion between the first and second layers 40 and 42 may be applied to the first layer 40. The thickness T3 of the second layer 42 may be greater than the thickness T1 of the first layer 40, and accordingly, a strain applied to the first layer 40 may be controlled by the second layer 42. In one example, the second layer 42 may directly contact some or all of the lower surface of the first layer 40. The thickness relationship between the first and second layers 40 and 42 may be also valid in the case of the first layer structure LS1. In the third layer structure LS3, the second layer 42 may be an insulating layer.

Figure 4:
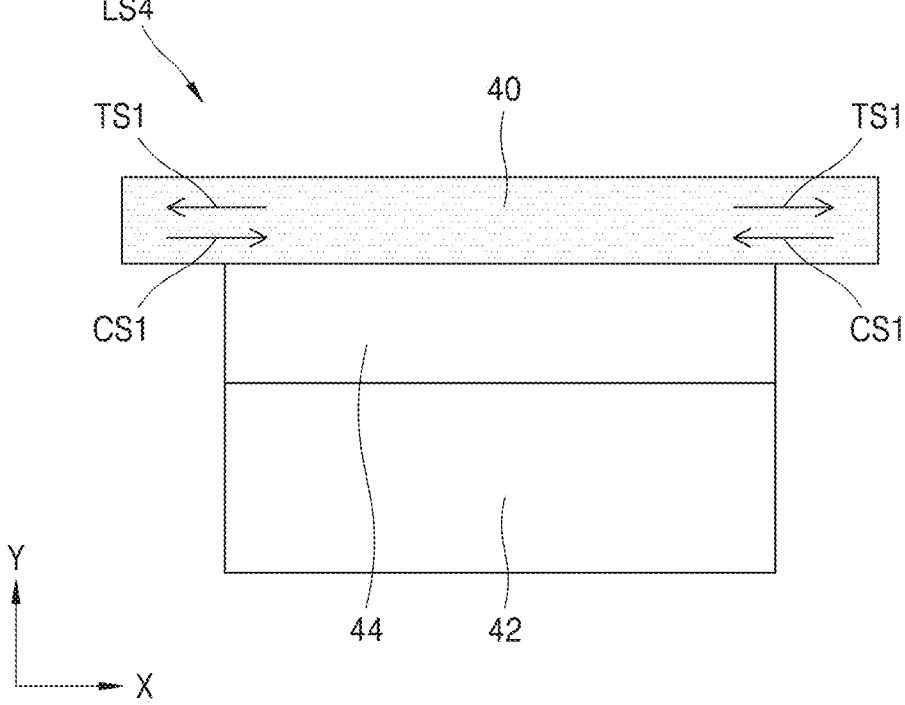

FIG. 4 shows a fourth layer structure LS4 that increases the operation characteristics according to an embodiment. Only parts different from the third layer structure LS3 will be described.

Referring to FIG. 4, the fourth layer structure LS4 may be the same as the case in which the buffer layer 44 is arranged between the first and second layers 40 and 42 in the third layer structure LS3. That is, the fourth layer structure LS4 may be formed by sequentially stacking the second layer 42, the buffer layer 44, and the first layer 40. A thickness relationship between the first layer 40, the buffer layer 44, and the second layer 42 may be the same as that of the second layer structure LS2.

Figure 5:
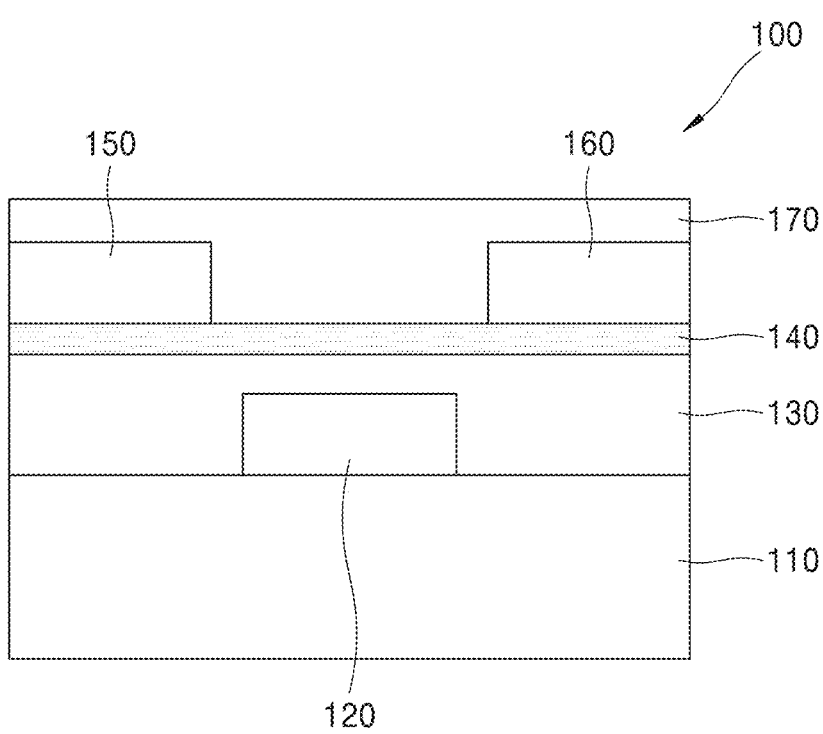
FIG. 5 is a cross-sectional view illustrating a first electronic device including a layer structure according to an example embodiment.

FIG. 5 shows a first electronic device 100 including a layer structure according to an embodiment. In one example, the first electronic device 100 may be a field-effect transistor (FET).

Referring to FIG. 5, a gate electrode 120 is arranged on a substrate 110. The substrate 110 may be a doped substrate or a conductive substrate. An insulating layer 130 covering the gate electrode 120 is formed on the substrate 110. The insulating layer 130 may cover an upper surface and side surfaces of the gate electrode 120 and cover an upper surface of the substrate 110 around the gate electrode 120. An upper surface of the insulating layer 130 may be parallel or substantially parallel to the upper surface of the substrate 110 on which the gate electrode 120 is formed. The upper surface of the insulating layer 130 may be flat. A portion of the insulating layer 130 covering the upper surface of the gate electrode 120 may have a uniform thickness and may be used as a gate insulating layer. The channel layer 140 is present on the insulating layer 130. The channel layer 140 may be formed to cover the entire upper surface of the insulating layer 130. The channel layer 140 may be a 2D material layer or may include a 2D material layer. The channel layer 140 may be an N-type channel layer or a P-type channel layer. First and second electrodes 150 and 160 are provided on the channel layer 140. The first and second electrodes 150 and 160 are separated from each other. One of the first and second electrodes 150 and 160 may be a source electrode, and the other one may be a drain electrode. The first and second electrodes 150 and 160 may be formed to have a layer structure in which the gate electrode 120 is located between the first and second electrodes 150 and 160. Accordingly, the first electronic device 100 is a bottom gate FET in which the gate electrode 120 is located below the channel layer 140.

A strain-inducing layer, that is, a stressor layer 170 is formed on the channel layer 140 between the first electrode 150 and the second electrode 160. The stressor layer 170 may cover the entire channel layer 140 between the first and second electrodes 150 and 160 and extend onto the first and second electrodes 150 and 160. In one example, the stressor layer 170 may be formed to directly cover a portion of the first electrode 150 and a portion of the second electrode 160. The stressor layer 170 may be in direct contact with the channel layer 140. A layer structure in which the channel layer 140 and the stressor layer 170 are sequentially stacked may correspond to the first layer structure LS1 of FIG. 1. That is, the material and electrical operation characteristics of the layer structure including the channel layer 140 and the stressor layer 170 may be the same as those of the first layer structure LS1.

Figure 6:
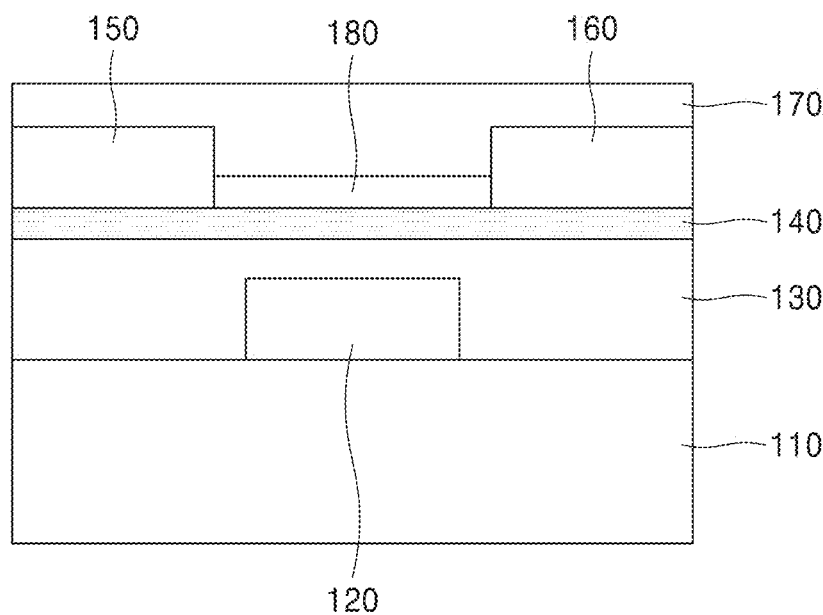
FIG. 6 is a cross-sectional view illustrating a case in which a buffer layer is provided between a channel layer and a stressor layer in the first electronic device of FIG. 5.

The first electronic device 100 may further include a buffer layer 180 between the channel layer 140 and the stressor layer 170 as shown in FIG. 6. The buffer layer 180 may be in direct contact with the channel layer 140 and the stressor layer 170. The buffer layer 180 may be positioned between the first and second electrodes 150 and 160 to directly contact the first and second electrodes 150 and 160. A layer structure in which the channel layer 140, the buffer layer 180, and the stressor layer 170 are sequentially stacked may correspond to the second layer structure LS2 of FIG. 2.

Figure 7:
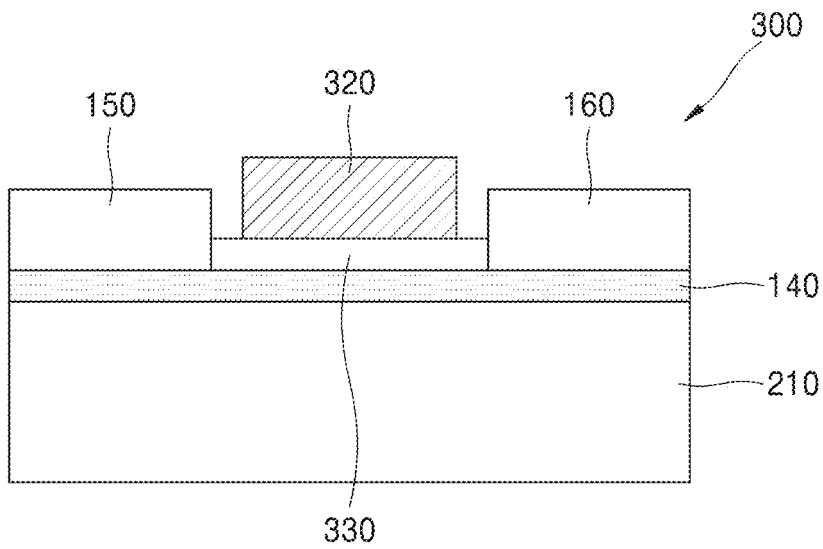
FIG. 7 is a cross-sectional view illustrating a second electronic device including a layer structure according to an embodiment.

FIG. 7 shows a second electronic device 300 including a layer structure according to an embodiment. Only parts different from the first electronic device 100 will be described. Like reference numerals denote like members, and the same applies to other drawings.

Referring to FIG. 7, a channel layer 140 is formed on one surface of a substrate 210. The substrate 210 may be an insulating substrate. In one example, at least an upper surface of the substrate 210 may be an insulating layer. The one surface of the substrate 210 may be an upper surface. The channel layer 140 may cover the entire surface of the substrate 210. First and second electrodes 150 and 160 separated from each other are arranged on the channel layer 140. A gate insulating layer 330 is formed on the channel layer 140 between the first and second electrodes 150 and 160. The gate insulating layer 330 may be formed to cover the entire channel layer 140 between the first and second electrodes 150 and 160. The gate insulating layer 330 may directly contact the first and second electrodes 150 and 160. In one example, the gate insulating layer 330 may correspond to the buffer layer 44 of the second layer structure LS2. A conductive stressor layer 320 is provided on the gate insulating layer 330. The stressor layer 320 may face the channel layer 140 with the gate insulating layer 330 therebetween. The stressor layer 320 may include a conductive material. Accordingly, the stressor layer 320 may also be used as a gate electrode. A layer structure in which the channel layer 140, the gate insulating layer 330, and the stressor layer 320 are sequentially stacked may correspond to the case when the second layer 42 is a conductive layer in the second layer structure LS2 of FIG. 2. The second electronic device 300 may be a top gate FET because the stressor layer 320 serving as a gate electrode is present on the channel layer 140.

Figure 8:
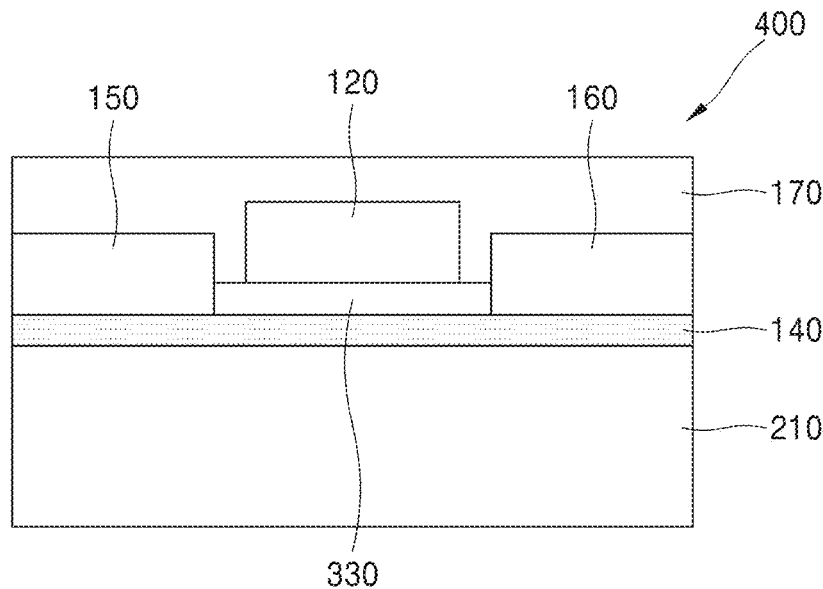
FIG. 8 is a cross-sectional view illustrating a third electronic device including a layer structure according to an embodiment.

FIG. 8 shows a third electronic device 400 including a layer structure according to an embodiment. Only parts different from the second electronic device 300 will be described.

Referring to FIG. 8, the third electronic device 400 is a top gate FET in which a gate insulating layer 330 and a gate electrode 120 are sequentially provided on an upper surface of a channel layer 140. A stressor layer 170 is formed on the channel layer 140. First and second electrodes 150 and 160, a gate insulating layer 330, and a gate electrode 120 are provided between the stressor layer 170 and the channel layer 140. Accordingly, the channel layer 140 does not directly contact the stressor layer 170. The gate electrode 120, the gate insulating layer 330, and the first and second electrodes 150 and 160 are covered with the stressor layer 170. The stressor layer 170 may be in direct contact with the gate insulating layer 330 exposed between the first and second electrodes 150 and 160 and the gate electrode 120. The stressor layer 170 may be an insulating layer or include an insulating layer. A layer structure in which the channel layer 140, the gate insulating layer 330, and the stressor layer 170 are sequentially stacked between the first and second electrodes 150 and 160 and the gate electrode 120 may correspond to the layer structure LS2 shown in FIG. 2. Accordingly, a strain applied to the channel layer 140 may be controlled by the stressor layer 170.

When the channel layer 140 is a layer including carbon, such as graphene in the first to third electronic devices 100, 300, and 400, the channel layer 140 may be separately formed and then transferred.

Figure 9:
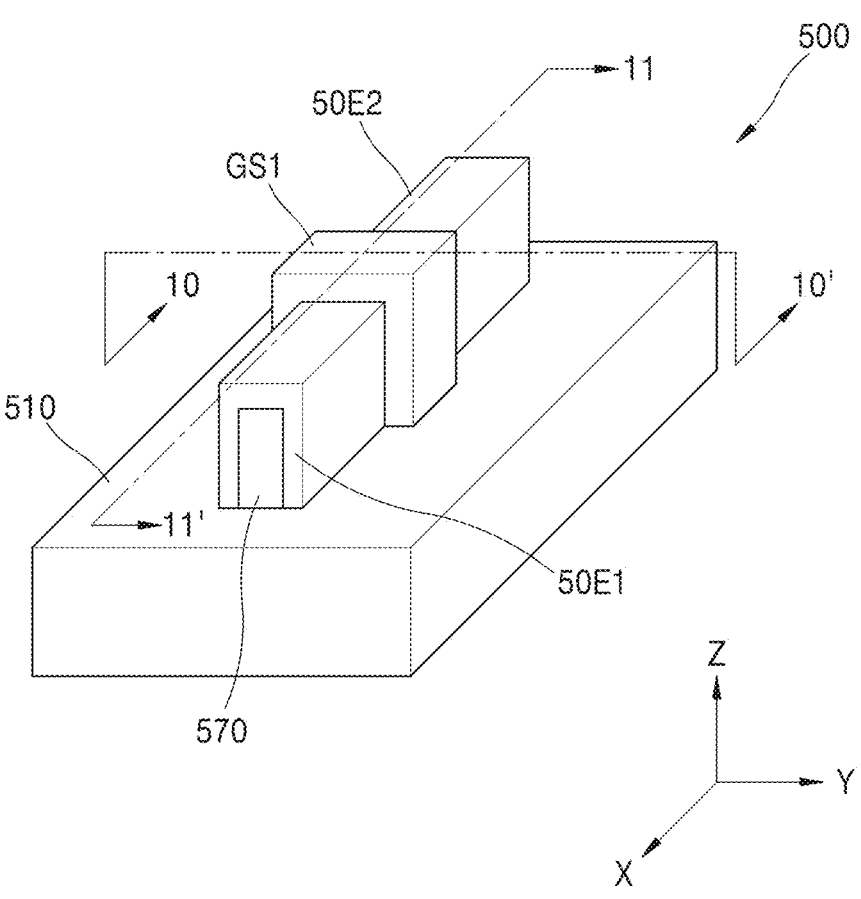
FIG. 9 is a three-dimensional view illustrating a fourth electronic device including a layer structure according to an embodiment.

FIG. 9 shows a fourth electronic device 500 including a layer structure according to an embodiment. The fourth electronic device 500 may be a fin field-effect transistor (FinFET).

Referring to FIG. 9, first and second electrodes 50E1 and 50E2 and a gate stack GS1 are aligned in a first direction on one surface of a substrate 510. The substrate 510 may include an insulating substrate. In one example, the substrate 510 may be a substrate including an insulating layer on one surface thereof. In this case, the first and second electrodes 50E1 and 50E2 and the gate stack GS1 may be formed on the one surface of the insulating layer. The one surface of the substrate 510 may be an upper surface of the substrate 510. The first direction may be parallel to the one surface or an X-axis of the substrate 510. The gate stack GS1 is arranged between the first electrode 50E1 and the second electrode 50E2. One of the first and second electrodes 50E1 and 50E2 may be a source electrode, and the other one may be a drain electrode. An aspect ratio of each of the first and second electrodes 50E1 and 50E2 and the gate stack GS1 may be greater than 1 (e.g., greater than 1 and less than or equal to 5 or less than or equal to 10), but is not limited thereto. In one example, a height in a Z-axis direction of each of the first and second electrodes 50E1 and 50E2 and the gate stack GS1 may be greater than, equal to, or less than a width in a Y-axis direction. The height of the gate stack GS1 may be greater than the heights of the first and second electrodes 50E1 and 50E2. Reference numeral 570 denotes a stressor layer, both side surfaces and an upper surface of which are covered with the first electrode 50E1.

Figure 10:
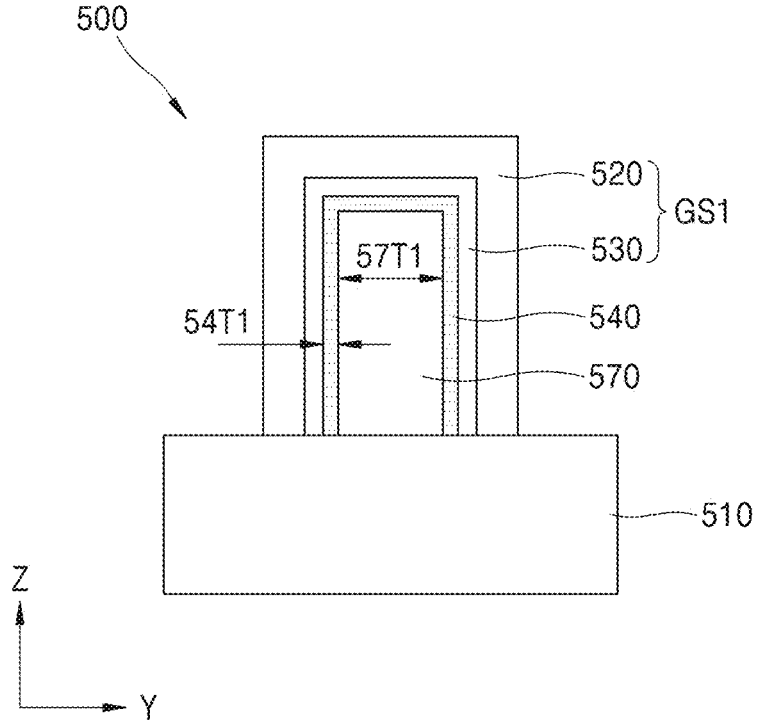
FIG. 10 is a cross-sectional view taken along line 10-10' of FIG. 9.

FIG. 10 is a cross-sectional view taken along line 10-10' of FIG. 9.

Referring to FIG. 10, the stressor layer 570 is formed on the substrate 510. An aspect ratio of the stressor layer 570 may be greater than one (e.g., greater than 1 and less than or equal to 5 or less than or equal to 10), but is not limited thereto. In one example, the aspect ratio of the stressor layer 570 may be 1 or less than 1. The stressor layer 570 may correspond to the second layer 42 of the third layer structure LS3 of FIG. 3. Both side surfaces and an upper surface of the stressor layer 570 are covered with a channel layer 540. A thickness 54T1 of the channel layer 540 formed on the stressor layer 570 may be constant or substantially constant. The thickness 54T1 of the channel layer 540 may be less than a thickness 57T1 of the stressor layer 570. A layer structure in which the stressor layer 570 and the channel layer 540 are sequentially stacked may correspond to the third layer structure LS3 of FIG. 3. Accordingly, a strain characteristic shown in the third layer structure LS3 may also appear in the layer structure in which the stressor layer 570 and the channel layer 540 are sequentially stacked. Accordingly, in a process of forming the fourth electronic device 500, a tensile strain or a compressive strain may be applied to the channel layer 540 according to a difference in coefficients of thermal expansion between the stressor layer 570 and the channel layer 540. According to a type (P-type or N-type) of the fourth electronic device 500, a strain applied to the channel layer 540 may be determined as either a tensile strain or a compressive strain. A gate insulating layer 530 and a gate electrode 520 are sequentially stacked on side and upper surfaces of the channel layer 540. Upper surfaces and side surfaces of the gate insulating layer 530 and the gate electrode 520 may be parallel to the upper surface and side surfaces of the channel layer 540, respectively. The sequentially stacked gate insulating layer 530 and the gate electrode 520 may be the gate stack GS1.

Figure 11:
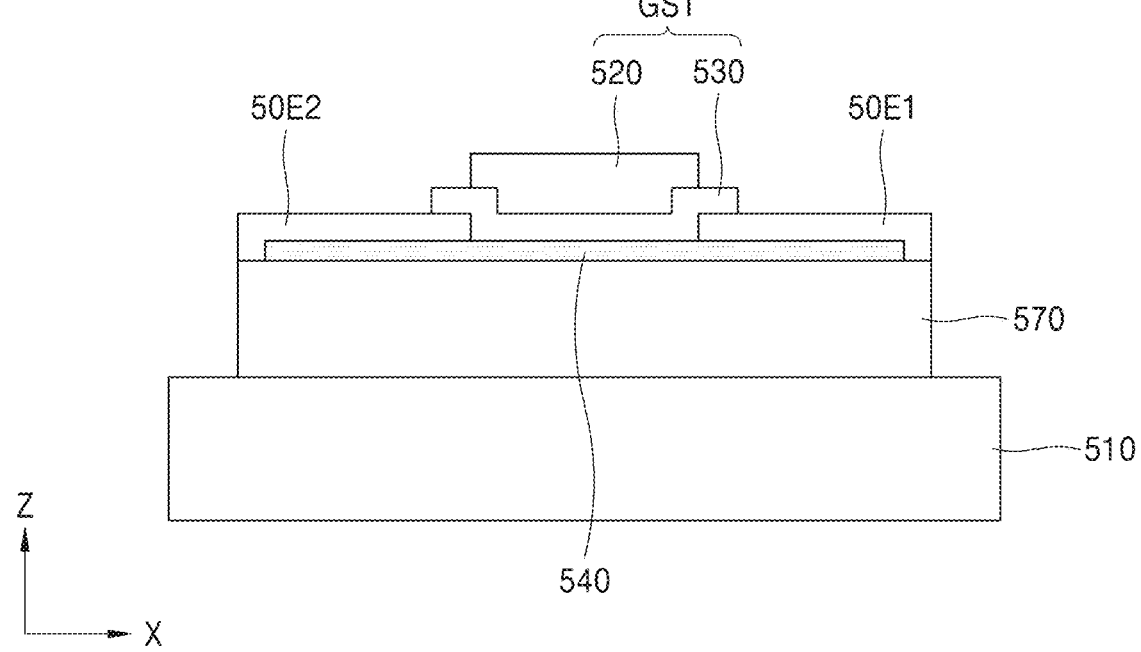
FIG. 11 is a cross-sectional view taken along line 11-11' of FIG. 9.

FIG. 11 is a cross-sectional view taken along line 11-11' of FIG. 9.

Referring to FIG. 11, the stressor layer 570 is formed on one surface of the substrate 510. The channel layer 540 is formed on an upper surface of the stressor layer 570. A layer structure in which the stressor layer 570 and the channel layer 540 are sequentially stacked may correspond to the third layer structure LS3 of FIG. 3. Although it is depicted that the channel layer 540 is formed on a part of an upper surface of the stressor layer 570, it may be formed to cover the entire upper surface of the stressor layer 570. The first and second electrodes 50E1 and 50E2 separated from each other are present on the channel layer 540. The first and second electrodes 50E1 and 50E2 may be formed to contact a portion of the stressor layer 570. The gate insulating layer 530 and the gate electrode 520 are sequentially formed on the channel layer 540 between the first and second electrodes 50E1 and 50E2. The gate insulating layer 530 may cover the entire channel layer 540 between the first electrode 50E1 and the second electrode 50E2, and a part of the gate insulating layer 530 may extend onto the first and second electrodes 50E1 and 50E2. The fourth electronic device 500 may be a top gate FinFET in which the gate electrode 520 is arranged on the channel layer 540.

Figure 12:
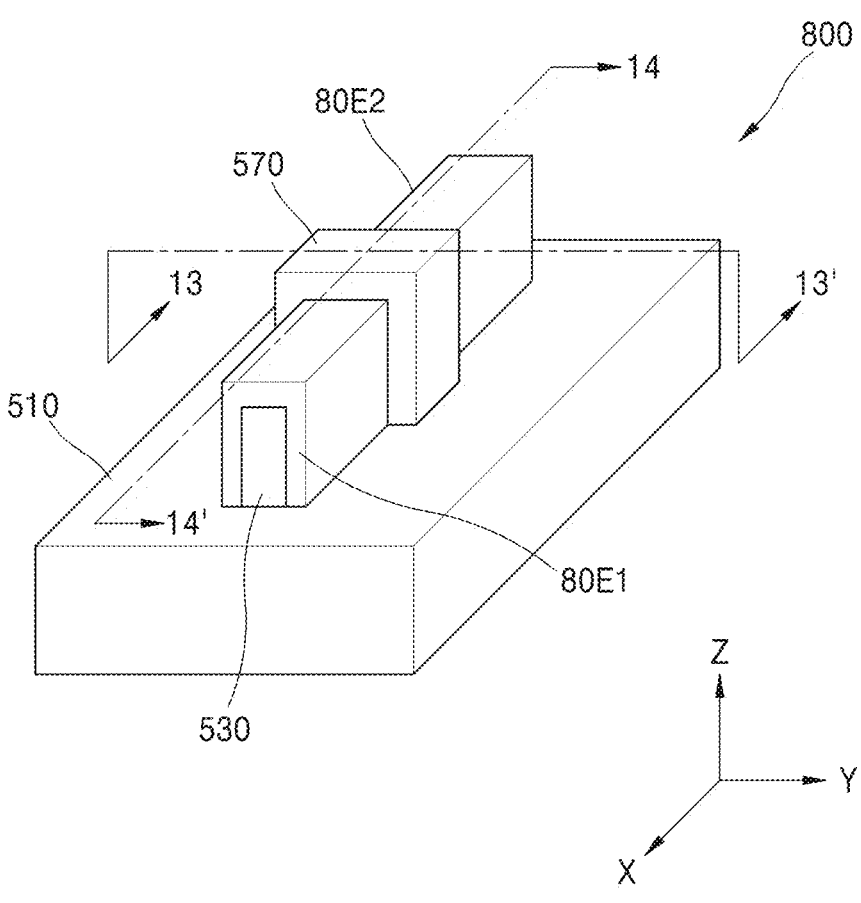
FIG. 12 is a three-dimensional view illustrating a fifth electronic device including a layer structure according to an embodiment.

FIG. 12 shows a fifth electronic device 800 including a layer structure according to an embodiment.

Referring to FIG. 12, a first electrode 80E1, a stressor layer 570, and a second electrode 80E2 are sequentially aligned on a substrate 510 in a direction parallel to the X-axis. An aspect ratio of each of the first and second electrodes 80E1 and 80E2 and the stressor layer 570 may be greater than 1 (e.g., greater than 1 and less than or equal to 5 or less than or equal to 10), but is not limited thereto, and in one example, the aspect ratio may be 1 or less than 1. A height of the stressor layer 570 may be greater than a height of the first and second electrodes 80E1 and 80E2. Reference numeral 530 denotes an insulating layer, both side surfaces and an upper surface of which are covered with the first electrode 80E1.

Figure 13:
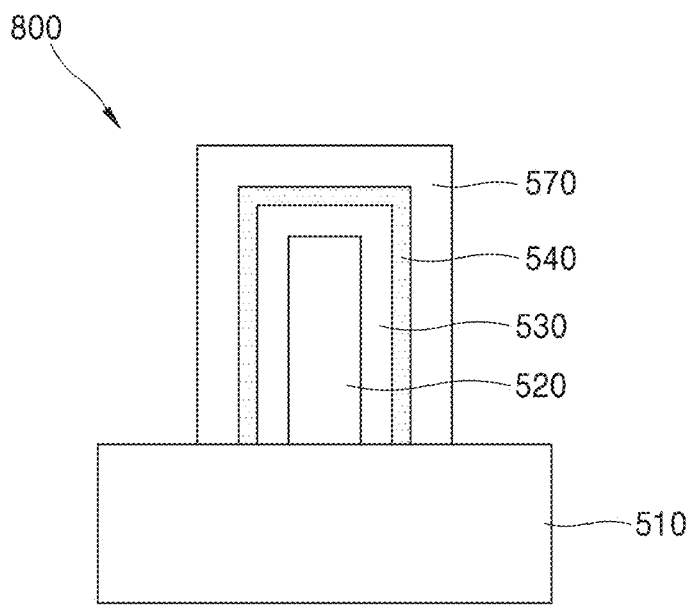
FIG. 13 is a cross-sectional view taken along line 13-13' of FIG. 12.

FIG. 13 is a cross-sectional view taken along line 13-13' of FIG. 12.

Referring to FIG. 13, a gate electrode 520 is formed on a substrate 510. An aspect ratio of the gate electrode 520 may be 1 or more (e.g., greater than 1 and less than or equal to 5 or less than or equal to 10), but may be less than 1. Both side surfaces and an upper surface of the gate electrode 520 are covered with the insulating layer 530. A thickness of the insulating layer 530 may be constant or substantially constant on the surface of the gate electrode 520. An upper surface and both side surfaces of the insulating layer 530 may be parallel to the upper surface and both side surfaces of the gate electrode 520. A channel layer 540 and a stressor layer 570 are sequentially formed on the upper surface and both sides of the insulating layer 530. The stressor layer 570 may be formed to have a thickness greater than that of the channel layer 540. A layer structure in which the channel layer 540 and the stressor layer 570 are sequentially stacked may correspond to the first layer structure LS1 of FIG. 1.

Figure 14:
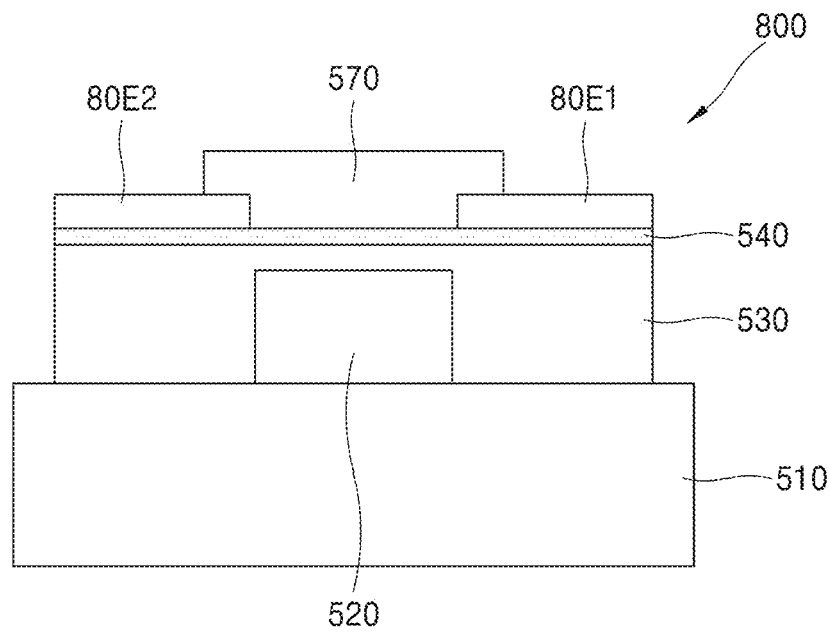
FIG. 14 is a cross-sectional view taken along line 14-14' of FIG. 12.

FIG. 14 is a cross-sectional view taken along line 14-14' of FIG. 12.

Referring to FIG. 14, the gate electrode 520 is formed on a region of the upper surface of the substrate 510. The insulating layer 530 covering the gate electrode 520 is formed on the upper surface of the substrate 510. The insulating layer 530 may be formed to cover the upper surface of the substrate 510 around the gate electrode 520 and to cover the upper surface and both side surfaces of the gate electrode 520. An upper surface of the insulating layer 530 is formed to be flat. A portion of the insulating layer 530 formed on the upper surface of the gate electrode 520 may have a constant thickness and may be used as a gate insulating layer. The channel layer 540 is formed on the flat surface of the insulating layer 530. The channel layer 540 may cover the entire upper surface of the insulating layer 530. The first and second electrodes 80E1 and 80E2 separated from each other are provided on the channel layer 540. One of the first and second electrodes 80E1 and 80E2 may be a source electrode, and the other one may be a drain electrode. The stressor layer 570 is provided on the channel layer 540 between the first electrode 80E1 and the second electrode 80E2. The stressor layer 570 may be arranged on the gate electrode 520. That is, the stressor layer 570 may be arranged to face the gate electrode 520 with the channel layer 540 therebetween. The stressor layer 570 may be formed to cover the entire channel layer 540 between the first and second electrodes 80E1 and 80E2. The stressor layer 570 may extend onto the first and second electrodes 80E1 and 80E2. In one example, the stressor layer 570 may be formed to cover the entire upper surfaces of the first and second electrodes 8E1 and 80E2. A layer structure in which the channel layer 540 and the stressor layer 570 are sequentially stacked may correspond to the first layer structure LS1 of FIG. 1. The fifth electronic device 800 may be a bottom-gate FinFET in which the gate electrode 520 is disposed under the channel layer 540.

Figure 15:
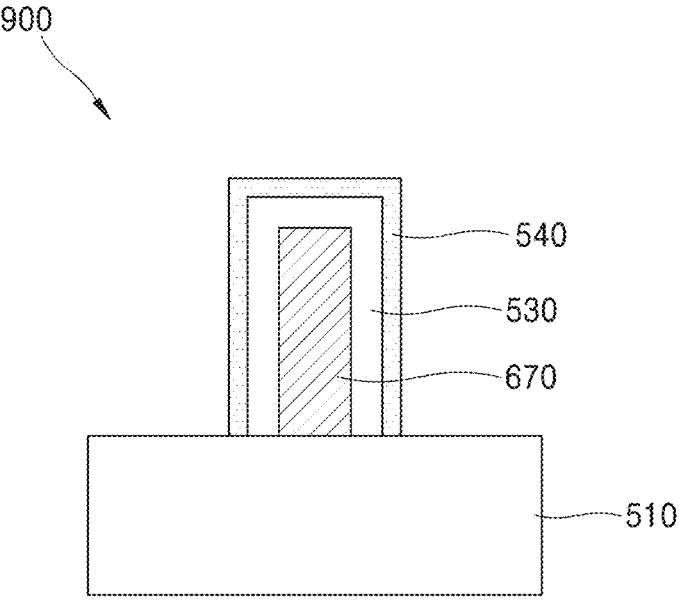
FIG. 15 is a cross-sectional view illustrating a sixth electronic device including a layer structure according to an embodiment.

FIG. 15 shows a sixth electronic device 900 having a layer structure according to an embodiment. The sixth electronic device 900 may be a FinFET.

Referring to FIG. 15, the sixth electronic device 900 includes a conductive stressor layer 670 on a substrate 510. An aspect ratio of the stressor layer 670 may be greater than or equal to one (e.g., greater than 1 and less than or equal to 5 or less than or equal to 10), but may be less than one. The stressor layer 670 may include a conductive material layer that may be used as a gate electrode. Accordingly, the stressor layer 670 may be used as a gate electrode while inducing a strain in the channel layer 540. That is, the conductive stressor layer 670 may be a strain-inducing layer and a gate electrode. An insulating layer 530 and a channel layer 540 are sequentially formed on an upper surface and both side surfaces of the stressor layer 670. A layer structure in which the conductive stressor layer 670, the insulating layer 530, and the channel layer 540 are sequentially stacked may correspond to a case in which the second layer 42 is a conductive layer in the fourth layer structure LS4 of FIG. 4.

Figure 16:
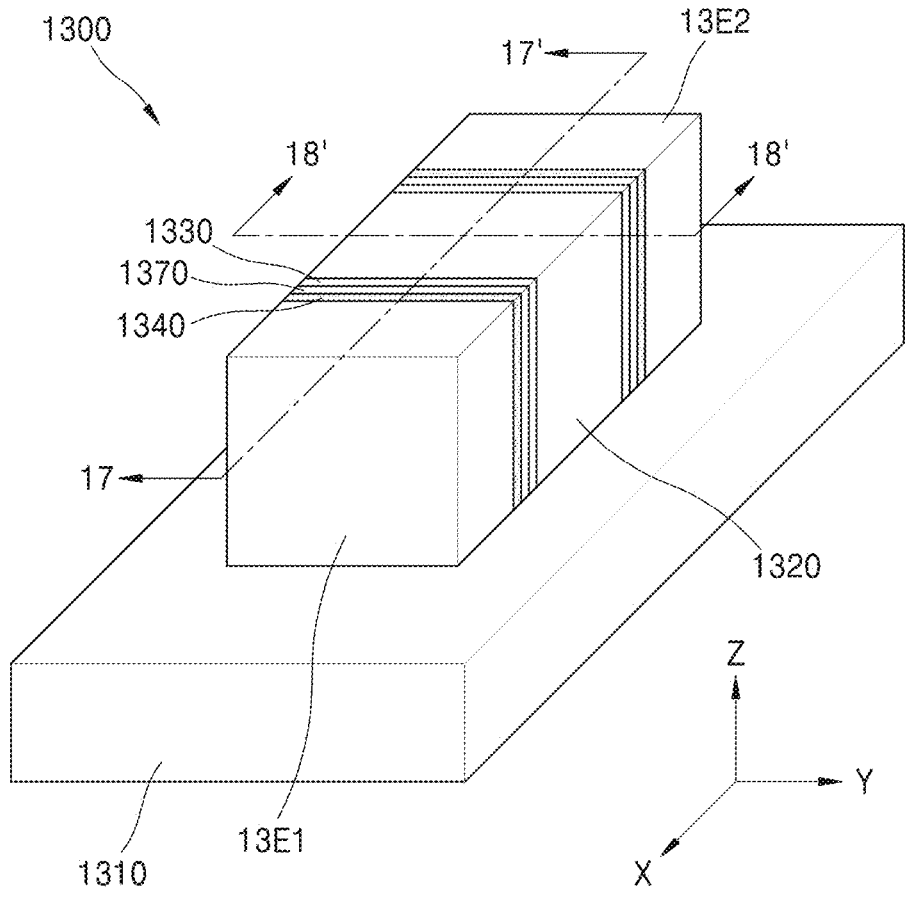
FIG. 16 is a cross-sectional view illustrating a seventh electronic device including a layer structure according to an embodiment.

FIG. 16 is a three-dimensional view of a seventh electronic device 1300 including a layer structure according to an embodiment. The seventh electronic device 1300 may be a FinFET.

Referring to FIG. 16, a first electrode 13E1, a gate electrode 1320, and a second electrode 13E2 are sequentially aligned on a substrate 1310 in a direction parallel to the X-axis. The substrate 1310 may be an insulating substrate. In one example, the substrate 1310 may include a semiconductor substrate having an insulating layer on a surface thereof. In this case, the semiconductor substrate may include, for example, Si, Ge, SiGe, or a Group III-V semiconductor material. The substrate 1310 may include, for example, a silicon substrate having a silicon oxide on a surface thereof, but is not limited thereto. Each of the first electrode 13E1, the gate electrode 1320, and the second electrode 13E2 may have an aspect ratio 1 or more (e.g., greater than 1 and less than or equal to 5 or less than or equal to 10), but may be less than 1. A channel layer 1340, a stressor layer 1370, and a gate insulating layer 1330 are sequentially formed between the first electrode 13E1 and the gate electrode 1320 in a direction from the first electrode 13E1 to the gate electrode 1320. A gate insulating layer 1330, a stressor layer 1370, and a channel layer 1340 are sequentially formed between the gate electrode 1320 and the second electrode 13E2 in a direction from the gate electrode 1320 to the second electrode 13E2. One of the first and second electrodes 13E1 and 13E2 may be a source electrode, and the other one may be a drain electrode. A height of the first and second electrodes 13E1 and 13E2 in a direction perpendicular to the substrate 1310 (a Z-axis direction) may be the same as a height of the gate electrode 1320, but is not limited thereto.

Figure 17:
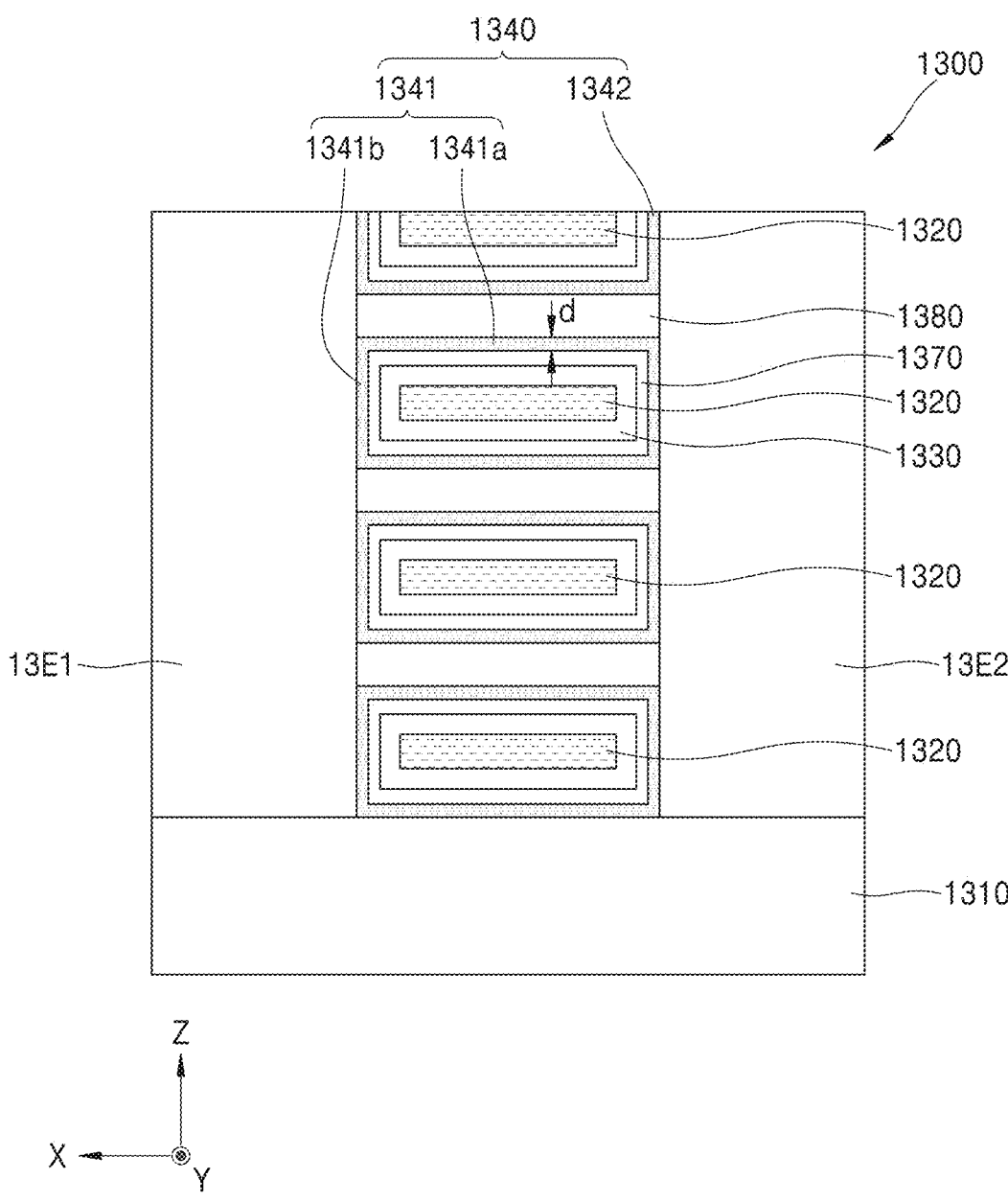
FIG. 17 is a cross-sectional view taken along line 17-17' of FIG. 16.

FIG. 17 is a cross-sectional view taken along line 17-17' of FIG. 16.

Figure 18:
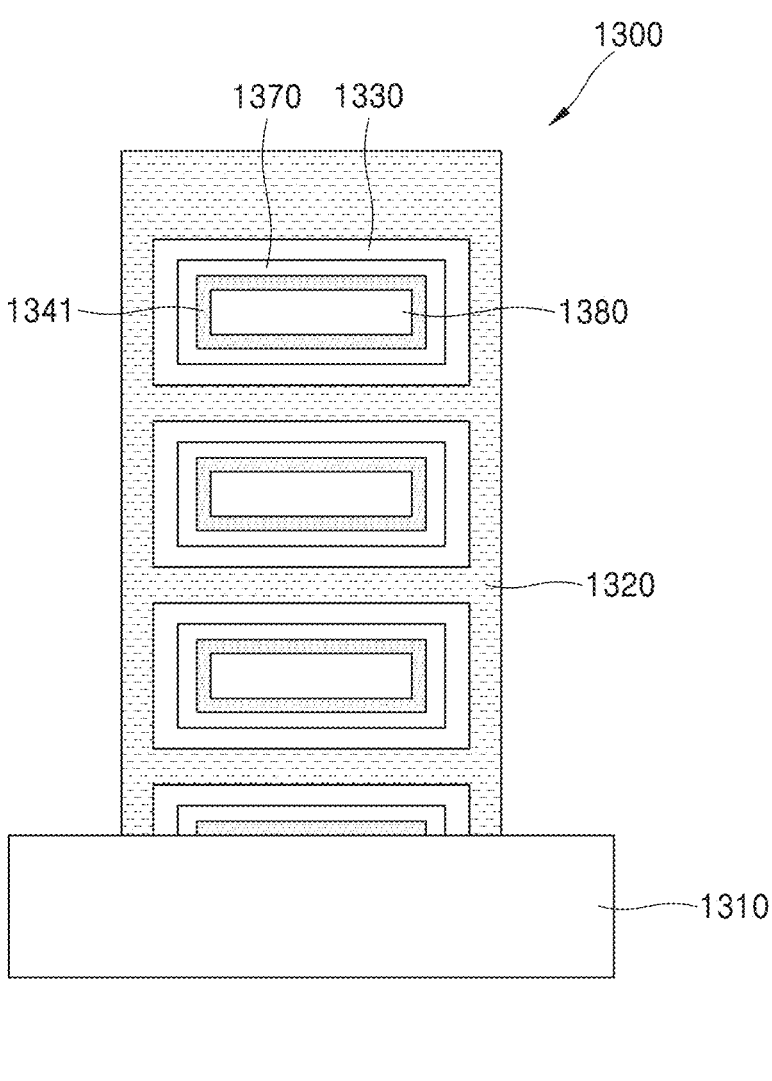
FIG. 18 is a cross-sectional view taken along line 18-18' of FIG. 16.

FIG. 18 is a cross-sectional view taken along line 18-18' of FIG. 16.

The cross-sectional view shown in FIG. 17 is a first cross-section cut across (an X-direction in the drawing) from the first electrode 13E1 to the second electrode 13E2 in a direction perpendicular to the substrate 1310 (in the Z-direction in the drawing). The cross-sectional view shown in FIG. 18 is a second cross-section cut across (a Y-direction in the drawing) between the first electrode 13E1 and the second electrode 13E2 in a direction perpendicular to the substrate 1310 (in the Z-direction in the drawing). Here, because the substrate 1310 may not be completely planar, the vertical direction may include a substantially vertical direction as well as a general vertical direction. In the specification, the definitions described above with respect to the first cross-section and the second cross-section are jointly used.

Referring to FIG. 17, the channel layer 1340 may include a first channel 1341 having a hollow closed-type cross-sectional structure in the first cross-section. The hollow closed-type cross-sectional structure may include a closed-loop shape including, for example, a square shape, a circular shape, an oval shape, or an irregular shape. The first channel 1341 may include, for example, a sheet part 1341a connected across the first electrode 13E1 and the second electrode 13E2 and a contact part 1341b that contacts the first electrode 13E1 and the second electrode 13E2. Because the sheet part 1341a is parallel or substantially parallel to the substrate 1310, the sheet part 1341a may be referred to as a horizontal part. The contact part 1341b may be referred to as a vertical part because the contact part 1341b is perpendicular or substantially perpendicular to the substrate 1310. The first channel 1341 may include two sheet parts 1341a. The contact part 1341b may support the two sheet parts 1341a and define a gap between the two sheet parts 1341a.

A plurality of first channels 1341 may be provided, and the first channels 1341 may be arranged to be separated from each other in a direction perpendicular to the substrate 1310 (the Z direction). In other words, the two adjacent first channels 1341 may be separately arranged from each other. The channel layer 1340 may include a second channel 1342 having an open cross-sectional structure or a sheet-like structure at least one of an upper end and a lower end in the first cross-section. The channel layer 1340 may be connected between the first electrode 13E1 and the second electrode 13E2 to serve as a passage through which a current flows between the first electrode 13E1 and the second electrode 13E2. The channel layer 1340 may directly contact the first electrode 13E1 and the second electrode 13E2. In one example, the channel layer 1340 may be connected to the first electrode 13E1 and the second electrode 13E2 through another medium.

Because the first channel 1341 has a hollow closed-type cross-sectional structure, the first channel 1341 may be in surface contact with the first electrode 13E1 and the second electrode 13E2, and a contact area of the surface contact may be increased by controlling a thickness of the hollow of the first channel 1341. That is, by controlling a length of a spacer part 1341b of the first channel 1341, a contact area between the first channel 1341 and the first electrode 13E1, and a contact area between the first channel 1341 and the second electrode 13E2 may be controlled. For example, the spacer part 1341b may have a length in a range of 100 nm or less. In one example, the spacer part 1341b may have a length in a range of 50 nm or less. In one example, the spacer part 1341b may have a length in a range of 20 nm or less. In one example, the spacer part 1341b may have a length in a range of 10 nm or less.

The first channel 1341 and the second channel 1342 may include a 2D semiconductor material. The 2D semiconductor material may include graphene, black phosphorus, phosphorene, or a transition metal dichalcogenide. The transition metal dichalcogenide may include one metal element selected from the group consisting of Mo, W, Nb, V, Ta, Ti, Zr, Hf, Tc, Re, Cu, Ga, In, Sn, Ge and Pb and one chalcogen element selected from the group consisting of S, Se and Te. In one example, the 2D semiconductor material may be doped with a desired and/or alternatively predetermined conductivity type dopant.

In one example, in the first channel 1341, the sheet part 1341a connected between the first electrode 13E1 and the second electrode 13E2 may have a thickness d in a range of 20 nm or less. In one example, the sheet part 1341a of the first channel 1341 may have a thickness d in a range of 10 nm or less. In one example, the sheet part 1341a of the first channel 1341 may have a thickness d in a range of 5 nm or less. In one example, the sheet part 1341a of the first channel 1341 may have a thickness d in a range of 1 nm or less. In one example, a distance between the first electrode 13E1 and the second electrode 13E2 may be in a range of 100 nm or less. In one example, a distance between the first electrode 13E1 and the second electrode 13E2 may be in a range of 50 nm or less. In one example, a distance between the first electrode 13E1 and the second electrode 13E2 may be in a range of 20 nm or less.

A gate insulating layer 1330 may be provided in the first channel 1341 and the second channel 1342. A gate electrode 1320 may be provided in the gate insulating layer 1330. In the first cross-section, the gate insulating layer 1330 may be provided inside the first channel 1341, and the gate electrode 1320 may be provided inside the gate insulating layer 1330. The stressor layer 1370 used as a layer that induces a strain in the first and second channels 1341 and 1342 during a manufacturing process is formed between the gate insulating layer 1330 and the first channel 1341 and between the gate insulating layer 1330 and the second channel 1342. In one example, the stressor layer 1370 may be in direct contact with the first and second channels 1341 and 1342 and the gate insulating layer 1330.

In the first cross-section, the first channel 1341 and the stressor layer 1370 may have a structure that surrounds the entire gate electrode 1320. Accordingly, the gate electrode 1320 may correspond to the entire inner surface of the first channel 1341 with the gate insulating layer 1330 and the stressor layer 1370 therebetween. A layer structure in which the stressor layer 1370 and the channel layer 1340 are sequentially stacked from the gate electrode 1320 to the channel layer 1340 may correspond to the third layer structure LS3 of FIG. 3. Although not shown, in one example, a buffer layer may further be provided between the channel layer 1340 and the stressor layer 1370. When the buffer layer is provided, the stressor layer 1370 may have a thickness greater than that of the first and second channels 1341 and 1342 and the buffer layer.

An insulating layer 1380 may further be provided between the adjacent first channels 1341 and between the first channel 1341 and the second channel 1342. The insulating layer 1380 may be arranged across the gap between the first electrode 13E1 and the second electrode 13E2. The insulating layer 1380 may directly contact the first electrode 13E1 and the second electrode 13E2. The insulating layer 1380 may insulate between channels from each other and function as a support layer for depositing the channels in a manufacturing process. In one example, the insulating layer 1380 may have a thickness greater than 0 nm and less than or equal to 100 nm. In one example, the insulating layer 1380 may have a thickness in a range of greater than 0 nm and less than or equal to 20 nm.

The insulating layer 1380 may include at least one of low-doped silicon, $SiO_2$, $Al_2O_3$, $HfO_2$, or $Si_3N_4$.

In an embodiment, the first channel 1341 may have a hollow closed-type cross-sectional structure, and may be connected with a multi-bridge structure between the first electrode 13E1 and the second electrode 13E2. The first electrode 13E1 and the second electrode 13E2 are separated from each other in a first direction on the substrate 1310, and the first channels 1341 may be arranged to be separated from each other in a second direction perpendicular to the substrate 1310 between the first electrode 13E1 and the second electrode 13E2. The first direction may be an X direction, and the second direction may be a Z direction.

Referring to FIG. 18, the channel layer 1340 may include the first channel 1341 having a hollow closed-type cross-sectional structure in the second cross-section. A plurality of first channels 1341 may be provided and arranged to be separated from each other. The gate insulating layer 1330 is provided in the first channel 1341, the stressor layer 1370 is provided between the first channel 1341 and the gate insulating layer 1330, and the gate electrode 1320 may be provided in the gate insulating layer 1330. In the second cross-section, the first channels 1341 may be separated from each other in a height direction of the seventh electronic device 1300, that is, in a direction perpendicular to the substrate 1310 (the Z-direction). In the second cross-section, the stressor layer 1370 and the gate insulating layer 1330 may be sequentially provided outside the first channel 1341. In the second cross-section, the stressor layer 1370 and the gate electrode 1320 may be provided to surround the first channel 1341. That is, the stressor layer 1370 surrounds the entire first channel 1341. In addition, the gate electrode 1320 surrounds the entire sides of the first channel 1341. Accordingly, the electronic device 1300 according to an embodiment may have a so-called all-around gate structure. The first channel 1341 in the first cross-section and the first channel 1341 in the second cross-section may be alternately provided in a direction perpendicular to the substrate 1310.

The insulating layer 1380 may be provided inside the first channel 1341.

As shown in FIG. 18, the gate insulating layer 1330 may have a shape that contacts the stressor layer 1370 and surrounds the first channel 1341 with a closed path. In addition, the gate electrode 1320 may be provided to be separated from the first channel layer 1341 with the gate insulating layer 1330 and the stressor layer 1370 therebetween. Also, the gate electrode 1320 may have a shape surrounding the first channel 1341 with a closed path. As described above, the gate insulating layer 1330 insulates between the first channel layer 1341 and the gate electrode 1320 and may suppress a leakage current.

The field-effect transistor according to the example embodiment includes a multi-bridged channel, thereby suppressing a short channel effect and effectively reducing a channel thickness and a channel length. The method of manufacturing a field-effect transistor according to an embodiment may easily form a very thin channel of several nm or less. In addition, because the field-effect transistor according to the embodiment includes a strain-induced channel layer according to the type of the transistor, carrier mobility of the channel may be increased.

The field-effect transistor according to an embodiment has a small size and has excellent electrical performance, thus, it is suitable for being applied to an integrated circuit device having a high degree of integration.

A field-effect transistor according to an embodiment may constitute a transistor constituting a digital circuit or an analog circuit. In some embodiments, the field-effect transistor according to an embodiment may be used as a high voltage transistor or a low voltage transistor. For example, the field-effect transistor according to an embodiment may be a flash memory device that is a nonvolatile memory device operating at a high voltage or a high voltage transistor constituting a peripheral circuit of an electrically erasable and programmable read only memory (EEPROM) device. Alternatively, the field-effect transistor according to an embodiment may be a transistor included in an IC chip for a liquid crystal display (LCD) that requires an operating voltage of 10V or more, for example, an operating voltage of 20V to 30V, or for a plasma display panel (PDP) that requires an operating voltage of 100V.

Figure 19:
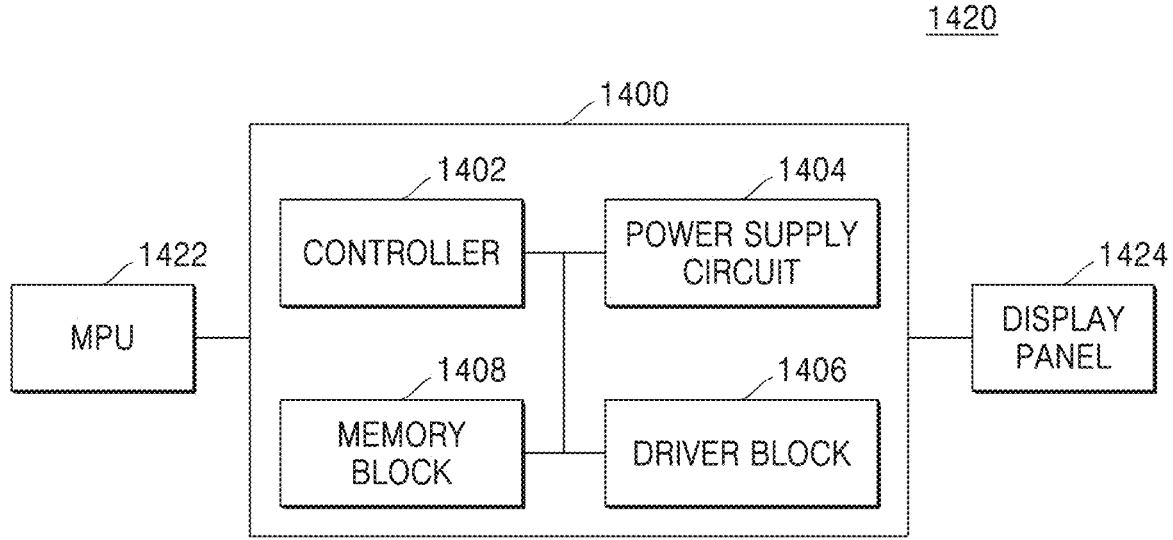
FIG. 19 is a schematic block diagram of a display driver integrated circuit (DDI) equipped with a field-effect transistor including a layer structure and a display device including the DDI according to an embodiment.

FIG. 19 is a schematic block diagram of a display driver IC (DDI) 1400 and a display device 1420 including the DDI 1400 according to an embodiment.

Referring to FIG. 19, the DDI 1400 may include a controller 1402, a power supply circuit 1404, a driver block 1406, and a memory block 1408. The controller 1402 receives and decodes a command applied from a main processing unit (MPU) 1422, and controls each block of the DDI 1400 to implement an operation according to the command. The power supply circuit 1404 generates a driving voltage in response to the control of the controller 1402. The driver block 1406 drives a display panel 1424 using the driving voltage generated by the power supply circuit 1404 in response to the control of the controller 1402. The display panel 1424 may be a liquid crystal display panel or a plasma display panel. The memory block 1408 is a block for temporarily storing commands input to the controller 1402 or control signals output from the controller 1402 or for storing necessary data, and may include a memory, such as RAM or ROM. The power supply circuit 1404 and the driver block 1406 may include the field-effect transistors according to the embodiments described above with reference to FIGS. 1 to 18.

Figure 20:
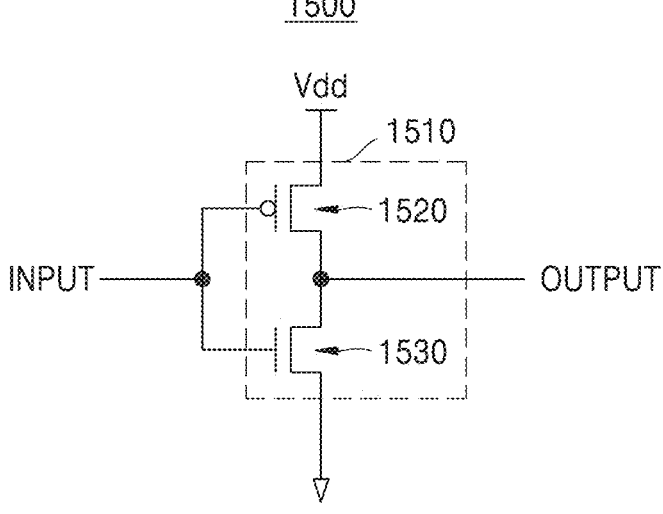
FIG. 20 is a circuit diagram of a complementary metal oxide semiconductor (CMOS) inverter equipped with a field-effect transistor including a layer structure according to an embodiment.

FIG. 20 is a circuit diagram of a complementary metal-oxide-semiconductor (CMOS) inverter 1500 according to an embodiment.

The CMOS inverter 1500 includes a CMOS transistor 1510. The CMOS transistor 1510 includes a p-type metal-oxide-semiconductor (PMOS) transistor 1520 and an n-type metal-oxide-semiconductor (NMOS) transistor 1530 disposed between a power terminal Vdd and a ground terminal. The CMOS transistor 1510 may include a field-effect transistor according to an embodiment described above with reference to FIGS. 1 to 18.

Figure 21:
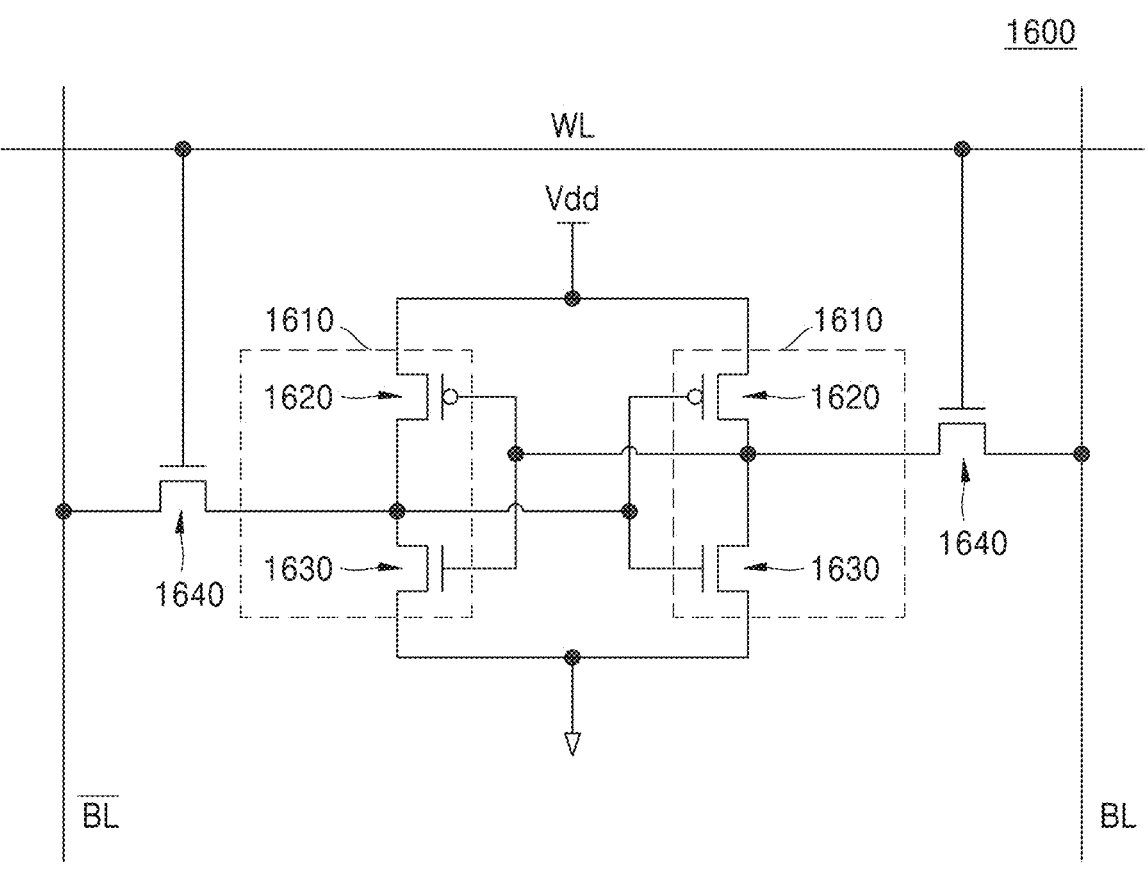
FIG. 21 is a circuit diagram of a CMOS static random-access memory (SRAM) device equipped with a field-effect transistor including a layer structure according to an embodiment.

FIG. 21 is a circuit diagram of a CMOS SRAM device 1600 according to an embodiment.

The CMOS SRAM device 1600 includes a pair of driving transistors 1610. The pair of driving transistors 1610 includes a PMOS transistor 1620 and an NMOS transistor 1630 disposed between a power terminal Vdd and a ground terminal. The CMOS SRAM device 1600 may further include a pair of transfer transistors 1640. A source of the transfer transistor 1640 is cross-connected to a common node of the PMOS transistor 1620 and the NMOS transistor 1630 constituting the driving transistor 1610. A power terminal Vdd is connected to the source of the PMOS transistor 1620, and a ground terminal is connected to the source of the NMOS transistor 1630. A word line WL may be connected to a gate of the pair of transfer transistors 1640, and a bit line BL and an inverted bit line/BL may be connected to a drain of each of the pair of transfer transistors 1640, respectively.

At least one of the driving transistor 1610 and the transfer transistor 1640 of the CMOS SRAM device 1600 may include the field-effect transistor according to the embodiment described above with reference to FIGS. 1 to 18.

Figure 22:
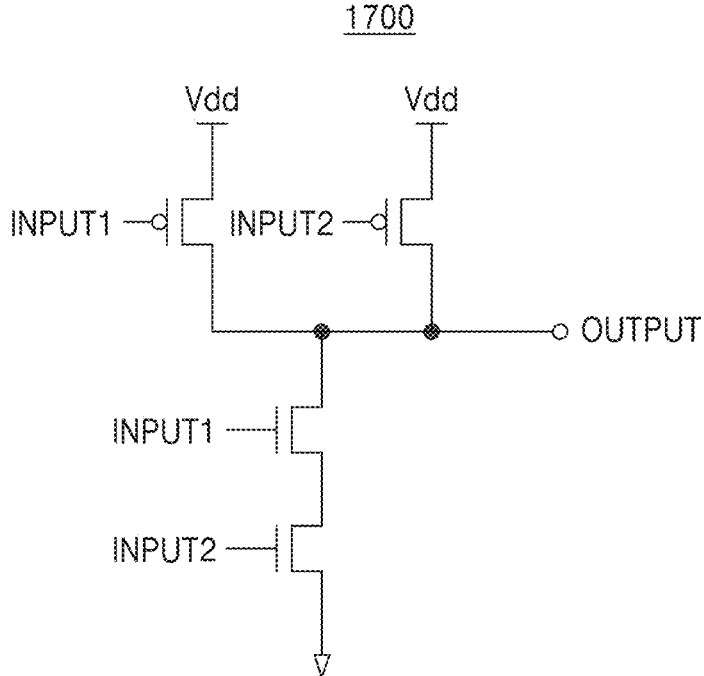
FIG. 22 is a circuit diagram of a CMOS NAND circuit equipped with a field-effect transistor including a layer structure according to an embodiment.

FIG. 22 is a circuit diagram of a CMOS NAND circuit 1700 according to an embodiment.

The CMOS NAND circuit 1700 includes a pair of CMOS transistors to which different input signals are transmitted. The CMOS NAND circuit 1700 may include the field-effect transistor according to the embodiment described above with reference to FIGS. 1 to 18.

Figure 23:
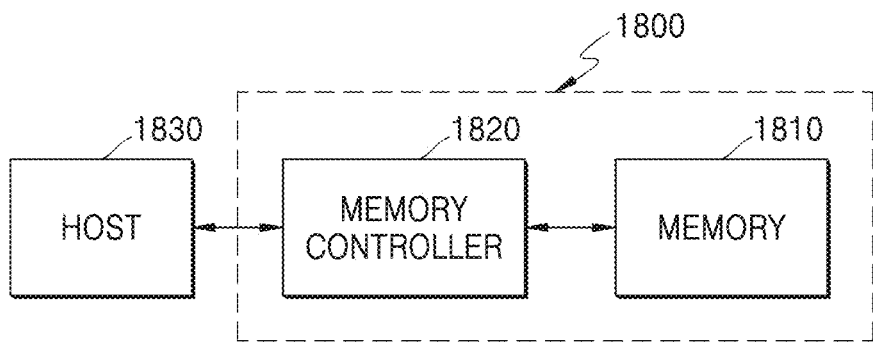
FIG. 23 is a block diagram of an electronic system equipped with a field-effect transistor including a layer structure according to an embodiment.

FIG. 23 is a block diagram illustrating an electronic system 1800 according to an embodiment.

The electronic system 1800 includes a memory 1810 and a memory controller 1820. The memory controller 1820 may control the memory 1810 to read data from and/or write data to the memory 1810 in response to a request from a host 1830. At least one of the memory 1810 and the memory controller 1820 may include the field-effect transistor according to the embodiment described above with reference to FIGS. 1 to 18.

Figure 24:
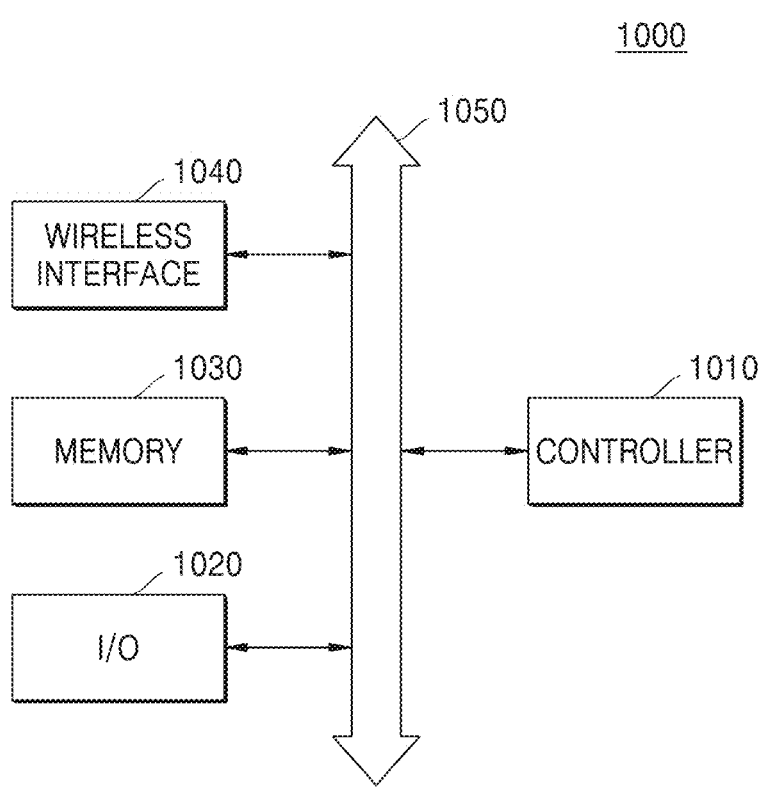
FIG. 24 is a block diagram of an electronic system equipped with a field-effect transistor including a layer structure according to an embodiment.

FIG. 24 is a block diagram of an electronic system 1900 according to an embodiment.

The electronic system 1900 may constitute a wireless communication apparatus or an apparatus capable of transmitting and/or receiving information under a wireless environment. The electronic system 1900 includes a controller 1910, an input/output device (I/O) 1920, a memory 1930, and a wireless interface 1940, which are interconnected to each other via a bus 1950.

The controller 1910 may include at least one of a microprocessor, a digital signal processor, or a processing device similar thereto. The I/O device 1920 may include at least one of a keypad, a keyboard, and a display. The memory 1930 may be used to store instructions executed by controller 1910. For example, the memory 1930 may be used to store user data. The electronic system 1900 may use the wireless interface 1940 to transmit/receive data via a wireless communication network. The wireless interface 1940 may include an antenna and/or a wireless transceiver. In some embodiments, the electronic system 1900 may be used in a communication interface protocol of a third-generation communication system, such as a code division multiple access (CDMA), a global system for mobile communications (GSM), a north American digital cellular (NADC), an extended-time division multiple access (E-TDMA), and/or a wide band code division multiple access (WCDMA). The electronic system 1900 may include the field-effect transistor according to the embodiments described above with reference to FIGS. 1 to 18.

The field-effect transistor according to the embodiment may exhibit good electrical performance with a subminiature structure, and thus may be applied to an integrated circuit device, and may realize miniaturization, low power, and high performance.

The layer structure includes a first material layer to which a strain is applied and a second material layer formed to apply a strain to the first material layer during manufacturing. The strain applied to the first material layer is applied in consideration of the type (P-type or N-type) of the first material layer. When the first material layer is a P-type channel, hole mobility may be increased by an applied strain, and when the first material layer is an N-type channel, electron mobility may be increased by an applied strain. Accordingly, in the case of an electronic device (e.g., a field-effect transistor) to which the layer structure is applied, an operating speed may be increased, and this effect may improve the operating speed of an electronic apparatus including the electronic device.

Figure 25:
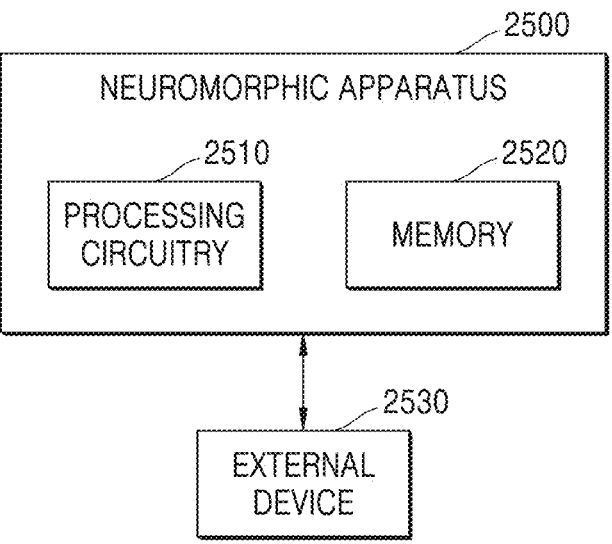
FIG. 25 is a diagram of a neuromorphic apparatus and an external device connected thereto in accordance with some example embodiments.

FIG. 25 is a diagram of a neuromorphic apparatus and an external device connected thereto in accordance with some example embodiments.

Referring to FIG. 25, a neuromorphic apparatus 2500 may include a processing circuitry 2510 and/or a memory 2520. The processing circuitry 2510 may include a hardware such as a logic circuit, a hardware/software combination such as a processor configured to execute software, or a combination thereof. For example, the processor may include a CPU, a graphics processing unit (GPU), an application processor (AP) included in the neuromorphic apparatus 2500, an ALU, a digital signal processor, a microcomputer, a FPGA, a SoC, a programmable logic unit, a microprocessor, and an ASIC, but is not limited thereto.

In some example embodiments, the processing circuitry 2510 may read/write various data with respect to an external device 2530, and/or may be configured to execute the neuromorphic apparatus 2500 using the read/written data. In some embodiments, the external device 2530 may include an external memory and/or a sensor array, each having an image sensor (for example, a complementary metal-oxide-semiconductor (CMOS) image sensor circuit).

In some example embodiments, the memory 2520 may be include random access memory (RAM) such as dynamic random-access memory (DRAM), static random-access memory (SRAM), etc., read-only memory (ROM), electrically erasable programmable read-only memory (EE-PROM), compact disk (CD)-ROM, Blu-ray or other optical disk storages, hard disk drive (HDD), solid state drive (SSD), or flash memory.

In some example embodiments, the processing circuitry 2510 may be configured to control a function for driving the neuromorphic apparatus 2500. For example, the processing circuitry 2510 may be configured to control the neuromorphic apparatus 2500 by executing a program stored in the memory 2520.

In some embodiments, the neuromorphic apparatus 2500 may be applied to a machine learning system. The machine learning system may use various artificial neural network organizing and processing models such as a convolutional neural network (CNN), a deconvolutional neural network, a recurrent neural network (RNN) including a long short-term memory (LSTM) unit and/or a gated recurrent unit (GRU), a stacked neural network (SNN), a state-space dynamic neural network (SSDNN), a deep faith network (DBN), a generative adversarial network, and/or a restricted Boltzmann machine (RBM).

Alternatively, or additionally, the machine learning system may include other forms of machine learning models, for example, linear and/or logistic regression, statistical clustering, Bayesian classification, decision tree, dimensionality reduction such as principal component analysis, an expert system, and/or a combination thereof including ensembles such as random forests. These machine learning models may be used to provide various services and/or applications. For example, an image classification service, a user authentication service based on biometrics or biometric data, an advanced driver assistance system (ADAS), a voice assistant service, or an automatic speech recognition (ASR) service may be executed by an electronic device.

In some embodiments, the processing circuitry 2510, memory 2520, and/or external device 2530 may include an electronic device according to one of the aforementioned embodiments, such as one of the electronic devices 100, 300, 400, 500, 800, 900, and 1300 discussed above in FIGS. 5 to 19.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a substrate;
a first electrode on the substrate;
a second electrode on the substrate and separated from the first electrode;
a gate electrode on the substrate and separated from the first electrode and the second electrode;
a channel layer connected to the first electrode and the second electrode, the channel layer separated from the gate electrode; and
a stressor layer on the channel layer is a strain-inducing layer,
wherein the channel layer has a trace of applied strain,
wherein the channel layer comprises a two-dimensional material,
wherein a thickness of the stressor layer is greater than a thickness of the channel layer, and
wherein the channel layer, the gate electrode, and the stressor layer vertically overlap each other.

2. The electronic device of claim 1, further comprising:
a buffer layer between the channel layer and the stressor layer.

3. The electronic device of claim 1,
wherein the channel layer includes a plurality of channels, and
the plurality of channels are vertically stacked and have a hollow closed-type cross-sectional structure.

4. The electronic device of claim 1,
wherein the channel layer includes a plurality of horizontal parts and a plurality of vertical parts,
the plurality of horizontal parts are sequentially stacked on the substrate, and
the plurality of vertical parts contact the first electrode and the second electrode.

5. The electronic device of claim 1,
wherein the two-dimensional material comprises transition metal dichalcogenide (TMD), black phosphorus (BP), or a material including carbon (C).

6. The electronic device of claim 5, wherein the TMD comprises $MoS_2$, $WS_2$, $MoSe_2$, or $WSe_2$.

7. The electronic device of claim 1,
the stressor layer surrounds the channel layer.

\* \* \* \* \*